(12) United States Patent
Yoshikawa et al.

(10) Patent No.: US 7,826,811 B2
(45) Date of Patent: Nov. 2, 2010

(54) PHASE MODULATION APPARATUS AND WIRELESS COMMUNICATION APPARATUS

(75) Inventors: Hiroyuki Yoshikawa, Tokyo (JP); Shunsuke Hirano, Kanagawa (JP)

(73) Assignee: Panasonic Corporation, Osaka (JP)

( * ) Notice: Subject to any disclaimer, the term of this patent is extended or adjusted under 35 U.S.C. 154(b) by 1028 days.

(21) Appl. No.: 11/594,979

(22) Filed: Nov. 9, 2006

(65) Prior Publication Data
US 2007/0149148 A1     Jun. 28, 2007

Related U.S. Application Data

(60) Provisional application No. 60/735,173, filed on Nov. 10, 2005.

(51) Int. Cl.
*H04B 1/16* (2006.01)
(52) U.S. Cl. .................. 455/205; 455/206; 455/216; 455/276.1
(58) Field of Classification Search ................ 332/144, 332/145, 16; 331/16
See application file for complete search history.

(56) References Cited

U.S. PATENT DOCUMENTS

| | | | | |
|---|---|---|---|---|
| 4,675,619 A * | 6/1987 | Uchibori et al. | ............. | 332/151 |
| 5,790,555 A * | 8/1998 | Narahashi et al. | ........... | 370/480 |
| 5,986,485 A * | 11/1999 | O'Sullivan | .................. | 327/156 |
| 6,085,077 A * | 7/2000 | Fields et al. | ................ | 455/303 |
| 6,327,313 B1 * | 12/2001 | Traylor et al. | ............... | 375/316 |
| 6,670,861 B1 * | 12/2003 | Balboni | ...................... | 332/103 |
| 6,809,585 B2 | 10/2004 | Chadwick | | |
| 6,829,471 B2 * | 12/2004 | White et al. | ............. | 455/194.2 |
| 6,844,763 B1 * | 1/2005 | Balboni | ...................... | 327/159 |
| 6,879,817 B1 * | 4/2005 | Sorrells et al. | .............. | 455/296 |

(Continued)

FOREIGN PATENT DOCUMENTS

JP     200323468     1/2003

(Continued)

OTHER PUBLICATIONS

International Search Report dated Dec. 12, 2006 with English translation.

*Primary Examiner*—Nay A Maung
*Assistant Examiner*—Richard Chan
(74) *Attorney, Agent, or Firm*—Dickinson Wright PLLC

(57) ABSTRACT

A two-point modulation type phase apparatus and a wireless communication apparatus capable of achieving a reduction in circuit scale and low power consumption while maintaining modulation precision. It is possible to provide a D/A converter (150) that converts the inputted digital baseband signal to an analog signal, an adder (110) that adds an output signal of a D/A converter (150) and an output of a loop filter (135) to output to a control voltage terminal of the voltage controlled oscillator (105), and a peak control section (140) provided at a front stage of the D/A converter (150) that carries out smoothing of peak portions appearing at the inputted digital baseband signal, at a two-point modulation type phase modulation apparatus (100) that modulates a-carrier frequency signal using an inputted digital baseband signal by setting a frequency dividing ratio of a frequency divider (115) of a PLL circuit based on an inputted digital baseband modulation signal, and adding a voltage corresponding to a signal that is an inputted digital baseband signal analog-converted for supply to a control voltage terminal of a voltage controlled oscillator (105).

11 Claims, 22 Drawing Sheets

U.S. PATENT DOCUMENTS

| | | |
|---|---|---|
| 7,120,396 B2 | 10/2006 | Wilson |
| 7,378,918 B2 * | 5/2008 | Hirano et al. ............... 332/144 |
| 2005/0232385 A1 | 10/2005 | Yoshikawa et al. |
| 2005/0242889 A1 | 11/2005 | Mitani et al. |

FOREIGN PATENT DOCUMENTS

| | | |
|---|---|---|
| JP | 2003510899 | 3/2003 |
| JP | 2004007704 | 1/2004 |
| JP | 2005287010 | 10/2005 |
| JP | 2005304004 | 10/2005 |

* cited by examiner

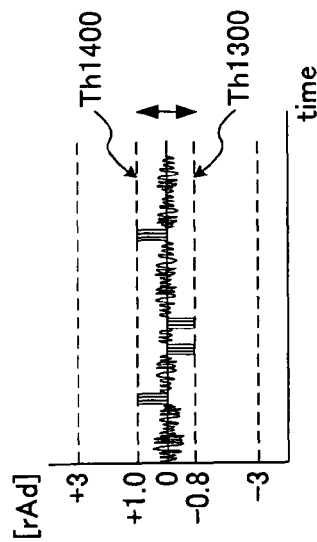
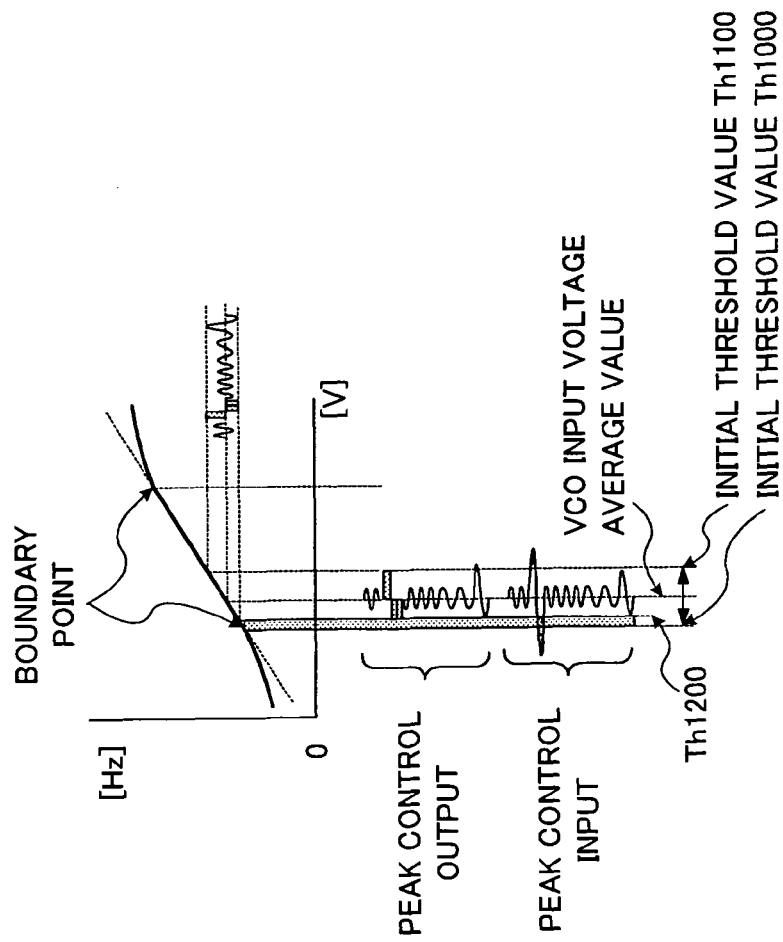
FIG.14B
FIG.14A

PHASE MODULATION APPARATUS AND WIRELESS COMMUNICATION APPARATUS

BACKGROUND OF THE INVENTION

1. Field of the Invention

The present invention relates to a phase modulation apparatus for modulating a carrier frequency signal using an inputted digital baseband modulation signal by carrying out modulation using a PLL (Phase Locked Loop), and wireless communication apparatus using this phase modulation apparatus.

2. Description of the Related Art

In the related art, a phase modulation apparatus employing PLL where a carrier signal is modulated by a baseband modulation signal so as to form a transmission signal (namely, a baseband modulation signal is up-converted to a wireless frequency) is widely employed. This type of phase modulation apparatus generally requires low cost, low power consumption, superior noise characteristics and high transmission characteristics, for example, precise modulation. Various configurations, such as a configuration where a modulation signal is inputted to a frequency divider or a configuration where a modulation signal is inputted to a VCO, are possible as a configuration for the phase modulation apparatus using this PLL. Further, a two-point modulation method is also proposed where modulation inside a PLL waveband and modulation outside a PLL waveband are carried out at two different locations (VCO and frequency divider) (see, for example, Japanese Patent Application Tokuhyo 2003-510899).

A configuration for a phase modulation apparatus using a broadband modulation PLL adopting this proposed two-point modulation method is shown in FIG. 22. As shown in the same drawing, this phase modulation apparatus is equipped with a PLL containing reference oscillator 1, limiter 2, reference frequency divider 3, phase frequency detector 4, charge pump 5, loop filter 6, voltage-controlled oscillator (VCO) 8, frequency divider 9 and adder 7, modulator 10, digital sigma modulator 13, charge pump scaling 16, modulation scaling 17, adders 11, 14, constant F12 and constant P15.

Voltage-controlled oscillator 8 of the PLL outputs an RF modulation signal. The oscillation frequency of this RF modulation signal changes according to a voltage inputted to control voltage terminal Vt of VCO 8. Frequency divider 9 divides the frequency of an RF modulation signal outputted by voltage controlled oscillator 8.

Phase frequency detector 4 compares the phase of a signal outputted by frequency divider 9 and the phase of a reference signal from reference oscillator 1, and outputs a signal (current) corresponding to the phase difference of both signals. Charge pump 5 converts the output current of phase frequency detector 4 to a voltage to output to loop filter 6. Control of residual modulation within the phase-locked loop is implemented as a result of charge pump 5 being controlled by charge pump scaling 16, and as a result, more accurate two-point modulation is possible. Loop filter 6 averages the output signal of charge pump 5.

Modulation scaling 17 is capable of scaling a modulation signal based on modulation data (Ka), namely capable of controlling amplitude scale of a modulation signal. Scaling at this modulation scaling 17 is carried out so as to ensure that, even if VCO sensitivity fluctuations (changing of the gradient of FIG. 23) occur as a result of manufacturing variation and temperature fluctuation, the amplitude scale of the output of the VCO before and after fluctuation is kept constant, and deterioration of this modulation precision is prevented as a result.

Multimode phase modulation from a narrow band to a broad band is therefore implemented using the two-point modulation method as in the above.

Further, even in technology of the related art shown in Japanese Patent Application Laid-Open No. 2004-7704, a voltage gain stage is provided where sensitivity fluctuations of a VCO due to manufacturing variations and temperature fluctuations are kept constant, and a configuration is adopted where frequency deviation is then drawn out from an error signal and a phase amplitude amount is controlled. Therefore, deterioration of modulation precision due to VCO sensitivity fluctuation is prevented.

As shown in FIG. 23, a region indicating non-linear characteristic exists between the input voltage and the output frequency at the VCO as shown in FIG. 23. When a PLL is locked at the region indicating a linear characteristic as shown in FIG. 23A, there is no deterioration in modulation precision. However, when the PLL is locked in the non-linear region or in the vicinity of the non-linear region, as shown in FIG. 23B, the input voltage is applied to a non-linear region which results in a problem that deterioration in a transmission characteristic, for example, deterioration in modulation precision.

In particular, when modulation scaling is carried out according to VCO sensitivity as shown in the technology of the related art, scaling is carried out so that amplitude increases when VCO sensitivity falls, but the possibility becomes still higher where VCO input voltage is applied to non-linear regions as a result. By such modulation scaling, deterioration of transmission characteristics such as, for example, modulation precision caused by application of a VCO input voltage to a non-linear region cannot be prevented.

Further, normally, the VCO input signal is an analog signal, and a D/A converter (provided at the latter stage of the modulation scale when modulation scaling is carried out according to VCO sensitivity fluctuations as in the related art) is therefore necessary. This D/A converter outputs an analog signal of an amplitude corresponding to an input bit string. A large peak appears at this analog signal. In this case, when precision of phase modulation is made high, it is necessary to adjust the number of bits of the input bit string of the D/A converter at the peak portion and it is therefore necessary for the number of bits to be large. When the number of bits is increased, a problem occurs where the circuit scale and the power consumption increase.

SUMMARY OF THE INVENTION

It is therefore an object of the present invention to provide a phase modulation apparatus and a wireless communication apparatus capable of achieving a reduction in circuit scale and low power consumption while maintaining transmission characteristics such as, for example, modulation precision.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which:

FIG. 14 is a diagram illustrating a function of a peak control section of FIG. 12;

DETAILED DESCRIPTION OF THE PREFERRED EMBODIMENTS

Now, embodiments of the present invention will be described in detail with reference to the drawings. In the embodiments, elements of the configuration that are the same are assigned the same numerals, and duplicate description will be omitted.

Embodiment 1

Figure 3:
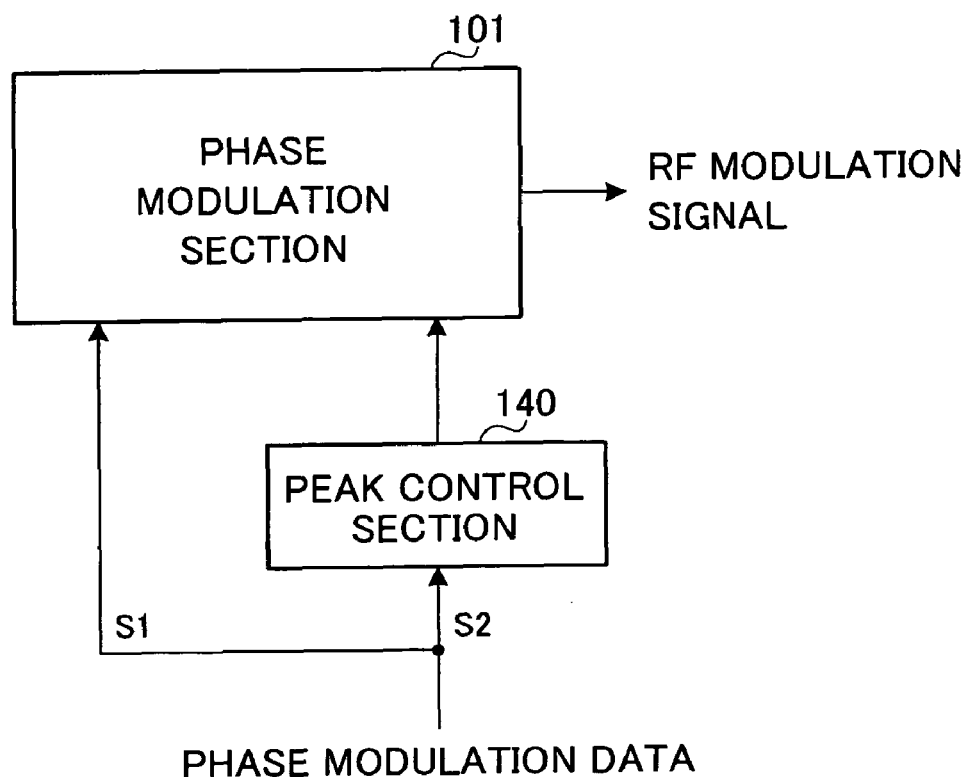
FIG. 3 is a block diagram showing a configuration for a phase modulation apparatus according to Embodiment 1 of the present invention.
Figure 4:
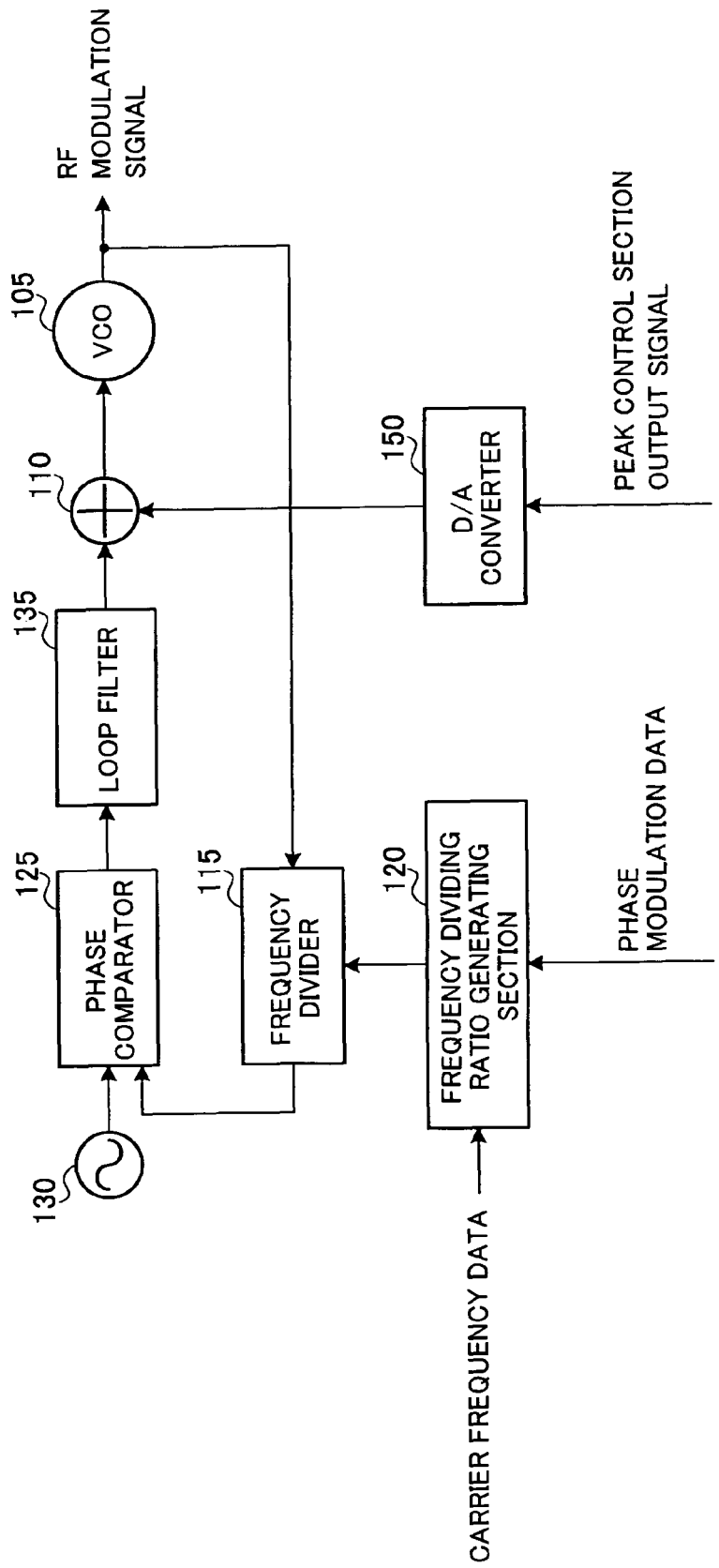
FIG. 4 is a block diagram showing a configuration of a phase modulation section of FIG. 3.

As shown in FIG. 3, phase modulation apparatus 100 of Embodiment 1 is equipped with phase modulation section 101 and peak control section 140. As shown in FIG. 4, phase modulation section 101 is equipped with a PLL having voltage controlled oscillator (VCO) 105, adder 110, frequency divider 115, phase comparator 125, reference signal generating section 130 and loop filter 135, frequency dividing ratio generating section 120 and D/A converter 150.

Voltage controlled oscillator 105 of the PLL has control voltage terminal Vt inputted with an output signal from adder 110, and outputs an RF modulation signal having a frequency corresponding to the voltage inputted to control voltage terminal Vt.

Frequency divider 115 inputs an RF modulation signal outputted by voltage controlled oscillator 105 and divides the frequency of the RF modulation signal based on a frequency dividing ratio generated at frequency dividing ratio generating section 120. The signal after this frequency division has a frequency within the PLL wave band.

Phase comparator 125 compares the phase of the signal outputted by frequency divider 115 after frequency division and the phase of the reference signal from reference signal generating section 130, and outputs a signal corresponding to the phase difference of both signals.

Loop filter 135 averages the output signal from phase comparator 125.

Frequency dividing ratio generating section 120 as a frequency dividing setting section sets frequency dividing ratio based on an inputted digital baseband signal S1 and a carrier signal (carrier frequency data) and outputs the frequency dividing ratio to frequency divider 115. In the above, the value of this frequency dividing ratio is the output of frequency divider 115, and is set so that the frequency of the signal after frequency dividing enters the PLL frequency band.

Figure 5A:
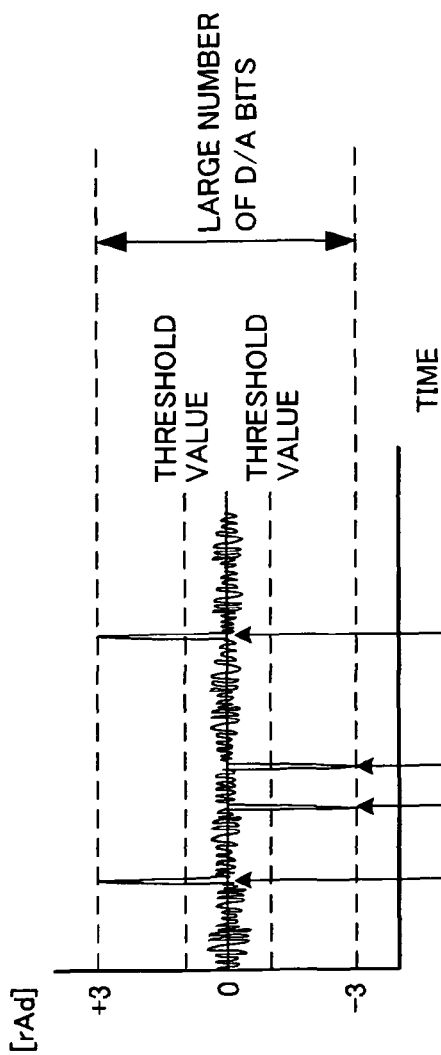
FIG. 5 shows a situation for an input signal and an output signal of a peak control section of FIG. 4.
Figure 5B:
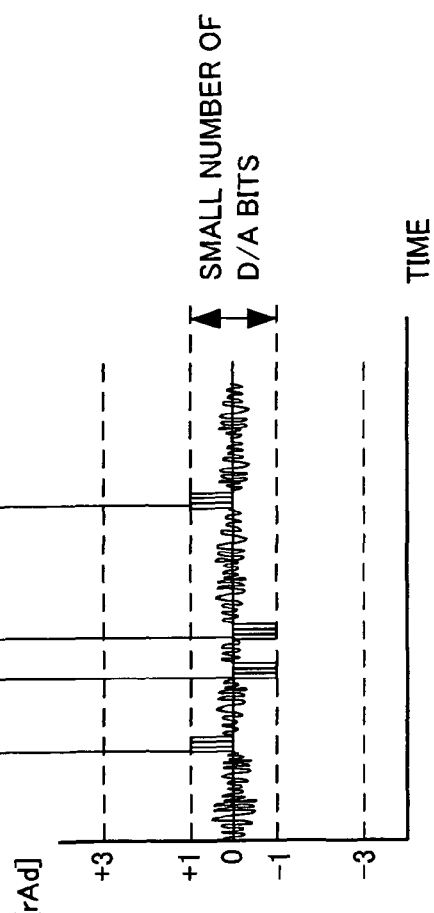

Peak control section 140 controls peaks by inputting digital baseband signal S2, and smoothing a peak appearing at digital baseband signal S2 that is the phase-modulated data described above. This "smoothing of the peak" is carried out by moving portions exceeding a predetermined threshold value of the peak portion to a portion less than the threshold value (refer to FIG. 5B). For example, a portion exceeding the predetermined threshold value of the peak portion is carried over sequentially, and is distributed at a portion not exceeding the threshold value under the limitation of reaching the threshold value. Here, digital baseband signal S2 is a quantized bit string where the amount of fluctuation in phase per unit time at a constellation, namely phase fluctuation speed is quantized.

Figure 6:
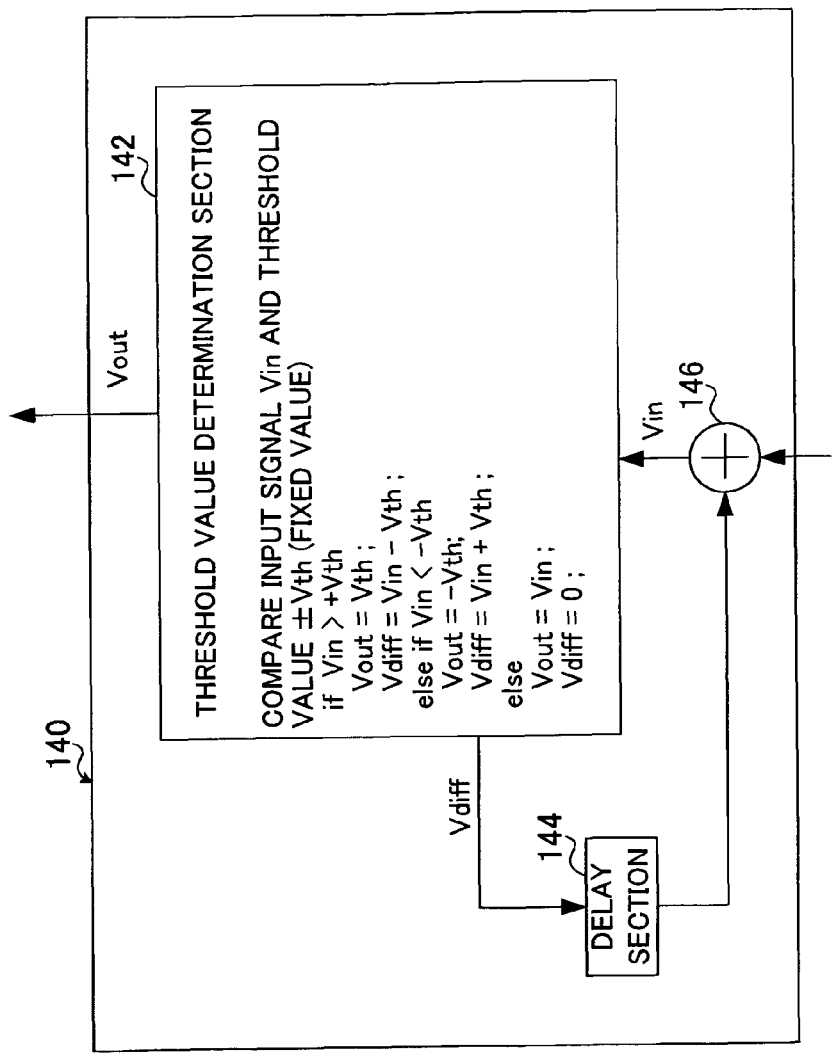
FIG. 6 is a block diagram showing a configuration for a peak control section of FIG. 4.

Specifically, peak control section 140 is configured from threshold value determination section 142, delay section 144, and adding section 146 as shown in FIG. 6.

Threshold value determination section 142 makes a threshold value determination using predetermined threshold value (Vth) on phase fluctuation speed (Vin) denoted by inputted quantized bit strings at each sample timing. When the phase fluctuation speed (Vin) of an inputted quantized bit string exceeds a predetermined threshold value (Vth), the portion exceeding the predetermined threshold value (Vth) of the phase fluctuation speed (Vin) denoted by the inputted quantized bit string, namely a differential bit string that is a differential (Vin−Vth=Vdiff) of phase fluctuation speed (Vin) and the predetermined threshold value (Vth) quantized is outputted to delay section 144, and a quantized bit string that is the phase fluctuation speed corresponding to the predetermined threshold value (Vth) is outputted to D/A converter 150. Further, as a result of the determination, when the phase fluctuation speed (Vin) denoted by the inputted quantized bit string is less than or equal to the predetermined threshold value (Vth), threshold value determination section 142 outputs the inputted quantized bit string to D/A converter 150.

Figure 23A:
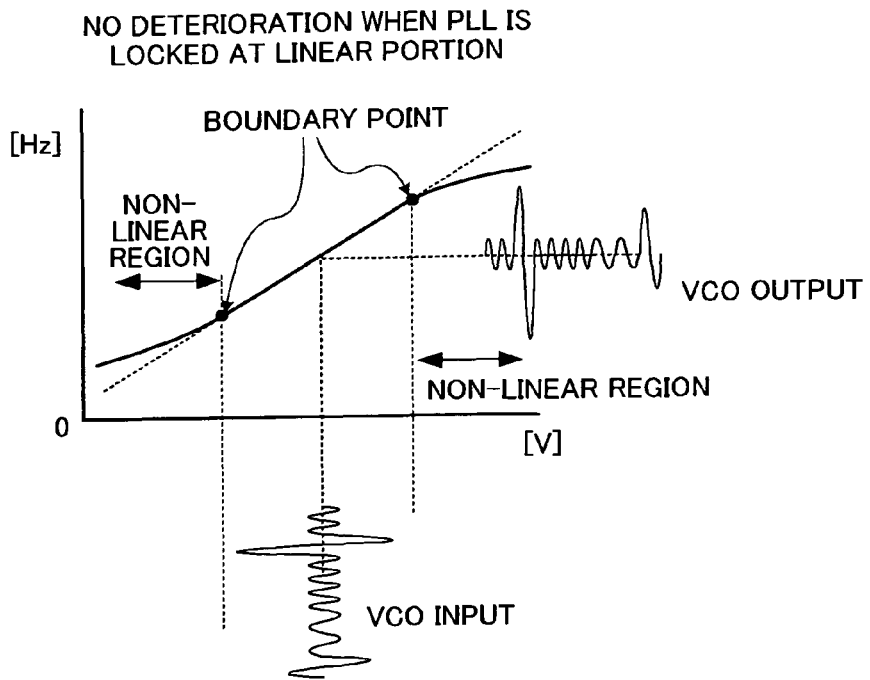
FIG. 23 is a diagram illustrating characteristics of a voltage controlled oscillator.
Figure 23B:
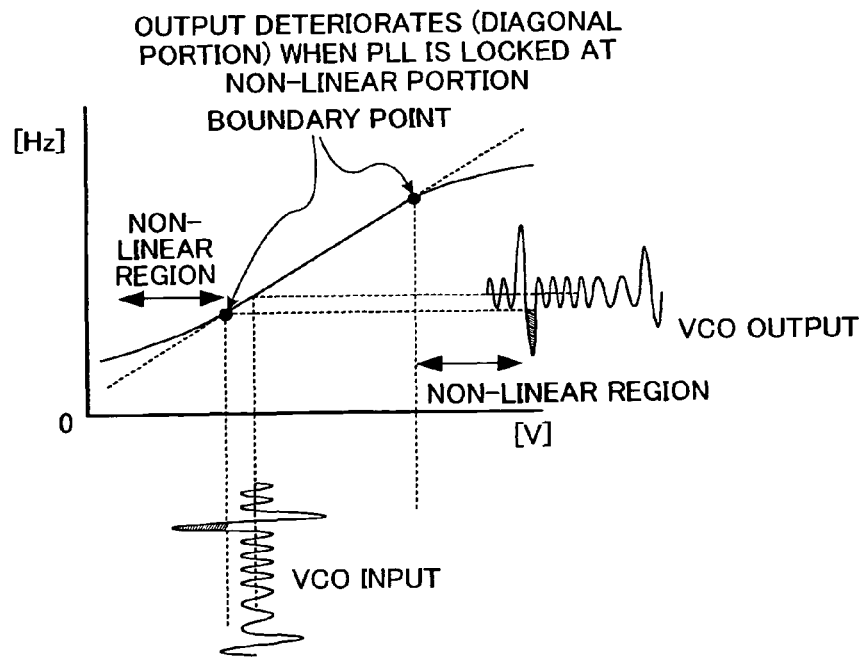

As shown in FIG. 23B, when a VCO input signal is inputted to the non-linear region, the modulation characteristics deteriorate so that it is not possible to lock and use the PLL at such region. If the amplitude of the input signal of the VCO is made small as a result of peak control, the range where PLL locking and usage are possible broadens. On the other hand, when the threshold value is too small, namely when the amount of suppression of the peak to be suppressed is made too large, the transmission characteristics deteriorate. The threshold value is therefore decided through a combination of the range where PLL locking is possible and the transmission characteristics. Further, the threshold value may be decided through a combination of circuit scale of the D/A converter, power consumption, and transmission characteristics. Moreover, it is also possible for this to be decided by combining the range where PLL locking is possible, circuit scale of the D/A converter, power consumption, and transmission characteristics.

Delay section 144 delays the differential quantized bit string from threshold value determination section 142 by just a predetermined delay time and outputs this to adding section 146. This delay time corresponds to sample timing interval.

Adding section 146 inputs digital baseband signal S2 and the differential quantized bit string outputted by delay section 144, "adds" digital baseband signal S2 and the differential quantized bit string, and outputs the added quantized bit string to threshold value determination section 142 as the inputted quantized bit string. Here, "adds" means generating a quantized bit string corresponding to the addition speed when phase fluctuation speed denoted by digital baseband signal S2 that is the quantized bit string and the phase fluctuation speed denoted by the differential quantized bit string are added.

At peak control section 140, the quantized bit string outputted by peak control section 140 is subjected to "smoothing of the peak" by moving the peak portion of the phase fluctuation speed exceeding the predetermined threshold value to a sample point less than the predetermined threshold value for the appearance of the peak onwards.

D/A converter 150 inputs the quantized bit string subjected to peak control at peak control section 140, and subjects this to digital to analog conversion to output to adder 110. The signal after digital to analog conversion also contains frequencies other than the PLL waveband.

Adder 110 adds an output signal from D/A converter 150 to the output signal from a loop filter, and outputs an addition signal for both signals to voltage controlled oscillator 105. This addition signal contains both a signal within the PLL waveband from loop filter 135 described above, and a signal containing frequencies outside of the PLL waveband from D/A converter 150, so that it is possible to implement broadband modulation by inputting this addition signal to voltage controlled oscillator 105.

Figure 7:
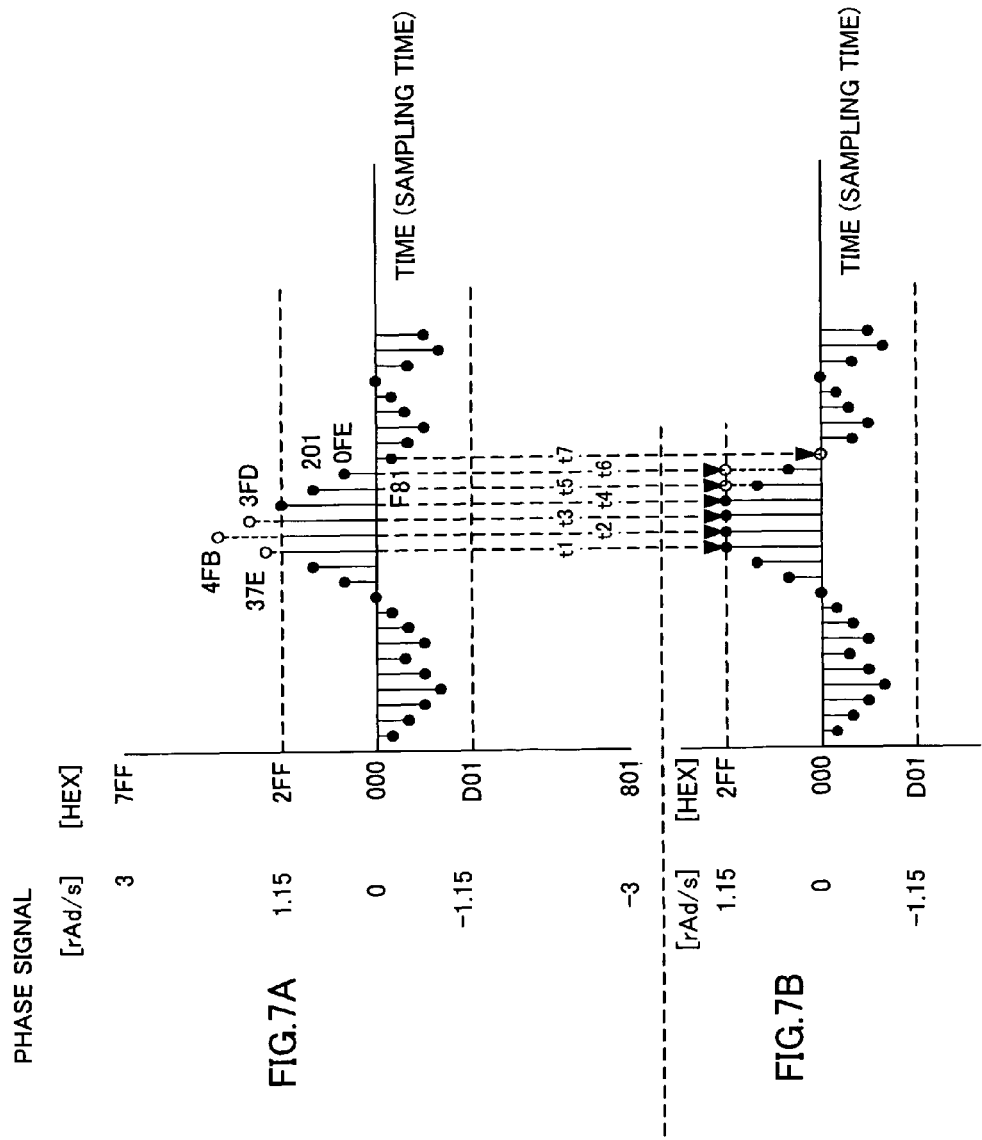
FIG. 7 is a diagram illustrating a function of a peak control section of FIG. 4.

Next, the details of the function of peak control section 140 will be described with reference to FIG. 7. FIG. 7A is a diagram plotting phase fluctuation speed indicated by the quantized bit string inputted to peak control section 140 with respect to the time axis. Further, FIG. 7B is a diagram plotting phase fluctuation speed indicated by the quantized bit string for after peak smoothing outputted from peak control section 140 with respect to the time axis. The vertical axis in both drawings indicates the phase fluctuation speed and the hexadecimal notation of the quantized bit string corresponding to the phase fluctuation speed. Further, the time interval of each point plotted corresponds to the sample timing interval.

When the quantized bit string is inputted sequentially to peak control section 140 as shown in FIG. 7A, the quantized bit string exceeds the threshold value at time t1 to t3. Here, the plus threshold value is 1.15 [rad/sec] (2FF[HEX]), and the minus threshold value is −1.15 [rad/sec] (D01[HEX]).

Peak control section 140 then distributes portions exceeding the threshold value, namely differential quantized bit string of t1 (37E−2FF), differential quantized bit string of t2 (4FB−2FF), and differential quantized bit string of t3 (3FD−2FF) to a sample timing less than the threshold value occurring after these timings so that added quantized bit strings for each sample timing do not exceed the threshold value. Namely, in FIGS. 7A and B, for before and after smoothing of the peak, there is no change in the integrated values (namely, phase fluctuation values) of the phase fluctuation speed occurring at each sample timing.

The portion exceeding the threshold value is in the vicinity of the origin on the I, Q constellation, and it is therefore preferable for distribution to take place by a symbol point on the I, Q constellation reached next. Modulation precision is determined using the symbol point. This means that if distribution is complete by this point, then modulation precision is not made to deteriorate. A plurality of sampling points is present between one symbol point and the next symbol point. For example, around ten sampling points at a symbol interval is appropriate.

However, after carrying out peak control, if distribution is not complete by the symbol point on the I, Q constellation reached next, the modulation precision will not be made to deteriorate substantially even if distribution takes place by the following symbol. Modulation precision is calculated using the average of the amount of errors from a plurality of symbol points.

As shown in FIG. 7B, peak control section 140 only outputs quantized bit strings that are within the threshold value (D01 to 2FF). Namely, the quantized bit string outputted by peak control section 140 can be expressed using a small number of bits. As a result, a quantized bit string of a small number of bits can be received by D/A converter 150 so that D/A conversion circuit scale can be reduced.

Further, if the peak portion is extracted, it is possible to input a quantized bit string of a small number of bits to D/A converter 150, but this causes errors in the phase fluctuation speed integrated values at VCO 105. However, the smoothing of the peak occurring at peak control section 140 as described above is carried out at a timing in the vicinity of a peak generated at the time of passing through the vicinity of an origin that is of little importance as a modulation signal, and change in the phase fluctuation value that is an integrated value of the phase fluctuation speed before and after peak smoothing does not occur. The phase fluctuation value in the vicinity of the symbols on the I, Q constellation that is of importance as a modulation signal does not change so much before and after smoothing of the peak. Further, fluctuation width of the voltage of the signal inputted to VCO 105 becomes small as a result of carrying out smoothing of the peak, so that the possibility becomes small where the frequency of the signal outputted by VCO 105 will be applied to a non-linear region. As a result, it is possible to reduce circuit scale while maintaining modulation precision by carrying out smoothing of the peak.

According to Embodiment 1, D/A converter 150 for converting the inputted digital baseband signal to an analog signal, adder 110 for adding the output signal of D/A converter 150 and the output of loop filter 135 of the PLL circuit, and outputting the addition signal to the control voltage terminal of voltage controlled oscillator 105 and peak control section 140 carrying out smoothing of peak portions appearing in the inputted digital baseband signal provided at the front stage of D/A converter 150 are provided at phase modulation apparatus 100 for modulating the carrier frequency signal using the inputted digital baseband modulation signal by setting a frequency dividing ratio of frequency divider 115 of the PLL circuit based on an inputted digital baseband modulation signal, and adding a voltage corresponding to a signal that is the inputted digital baseband signal analog-converted for supply to a control voltage terminal of voltage controlled oscillator 105 of the PLL circuit. For example, peak control section 140 carries out smoothing of the peak portions by moving portions of the peak portions exceeding a predetermined threshold value to portions less than the predetermined threshold value after the appearance of the peak portion.

By doing this, smoothing of peak portions appearing in the inputted digital baseband signal is carried out, and the signal outputted by peak control section 140, namely the signal inputted to D/A converter 150 can then be represented with a small number of bits, thereby reducing the circuit scale of D/A converter 150. Further, rather than cutting peak portions, peak control section 140 subjects the peak portions to smoothing. This means that changes in the integration value (phase fluctuation value) of the signal inputted to voltage controlled oscillator 105 before and after smoothing of the peak does not occur, and that there is little change in the phase fluctuation value in the vicinity of the symbol in the I, Q constellation that has importance taken as a modulation signal before and after smoothing of the peak, thereby maintaining modulation precision.

Peak control section 140 is comprised of adding section 146 for adding a phase fluctuation speed signal denoted by the inputted digital baseband signal and a phase fluctuation differential signal every sample timing, threshold value determination section 142 for determining phase fluctuation speed indicated by an addition signal from adding section 146 using the threshold value, and delay section 144 for subjecting the phase fluctuation signal from threshold value determination section 142 to a delay corresponding to the sample timing interval. When the phase fluctuation speed indicated by the addition signal exceeds the threshold value, threshold value determination section 142 outputs the portion exceeding the threshold value as the phase fluctuation differential signal and outputs the phase fluctuation speed signal corresponding to the threshold value to D/A converter 150, and when the phase fluctuation speed indicated by the addition signal is less than the threshold value, outputs the addition signal as is to D/A converter 150.

By doing this, smoothing of the peak is carried out using samples close to the peak portion. The influence exerted on phase fluctuation values in the vicinity of the symbols on the I, Q constellation can therefore be kept to a minimum, thereby maintaining modulation precision.

Figure 8:
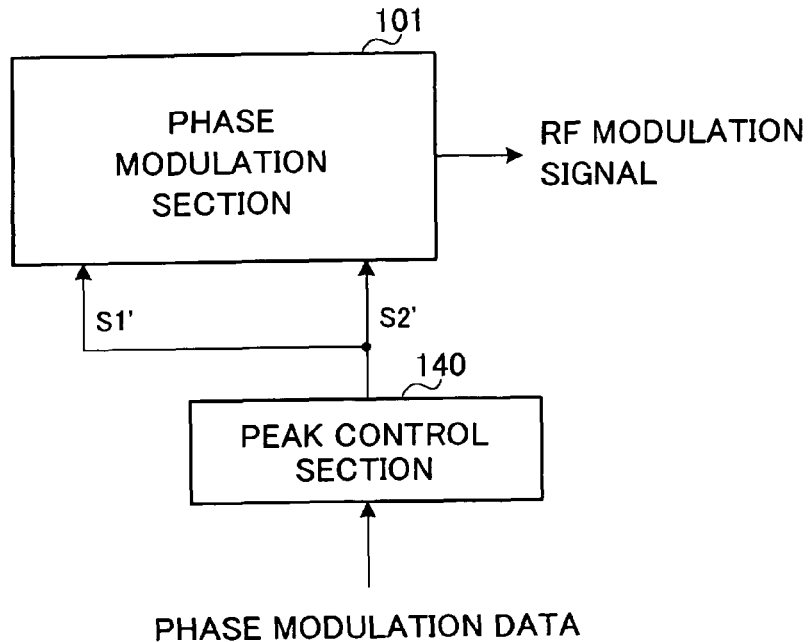
FIG. 8 is a block diagram showing a further configuration for a phase modulation apparatus according to Embodiment 1 of the present invention.

Further, the position of peak control section 140 in FIG. 3 does not by any means have to be this position. In FIG. 8, phase modulated data is forked after being inputted to peak control section 140 and is then inputted to phase modulation section 101. At the two-point modulation type phase modulation apparatus, filtering carried out on the modulation signal component of S1' with the equivalent of a low-pass characteristic may also be considered. The frequency component of the peak is high, and substantially does not change even without carrying out peak control on S1'. The position of peak control section 140 therefore obtains the same results as for the position shown in FIG. 8.

Further, phase modulation section 101 is by no means limited to be a two-point modulation type.

Figure 9:
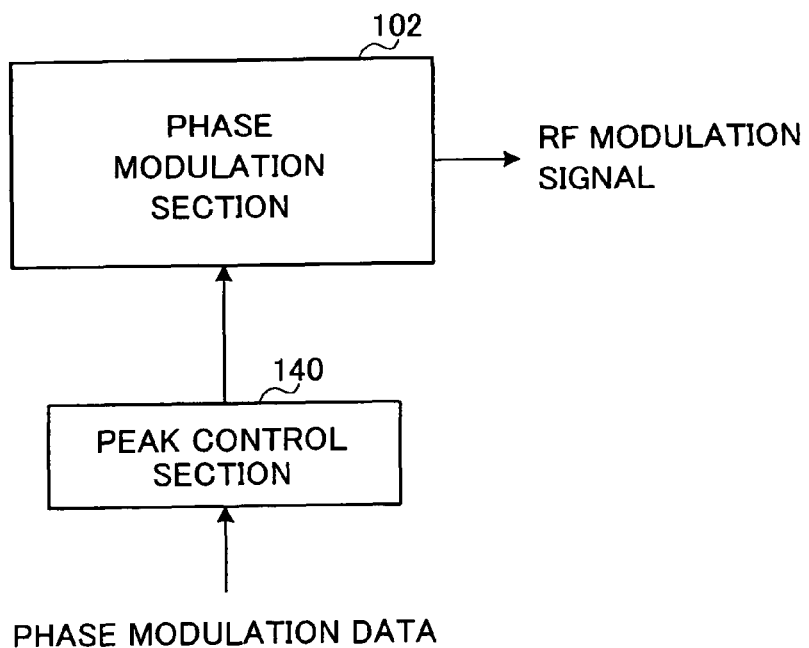
FIG. 9 is a block diagram showing a further configuration for a phase modulation apparatus according to Embodiment 1 of the present invention.
Figure 10:
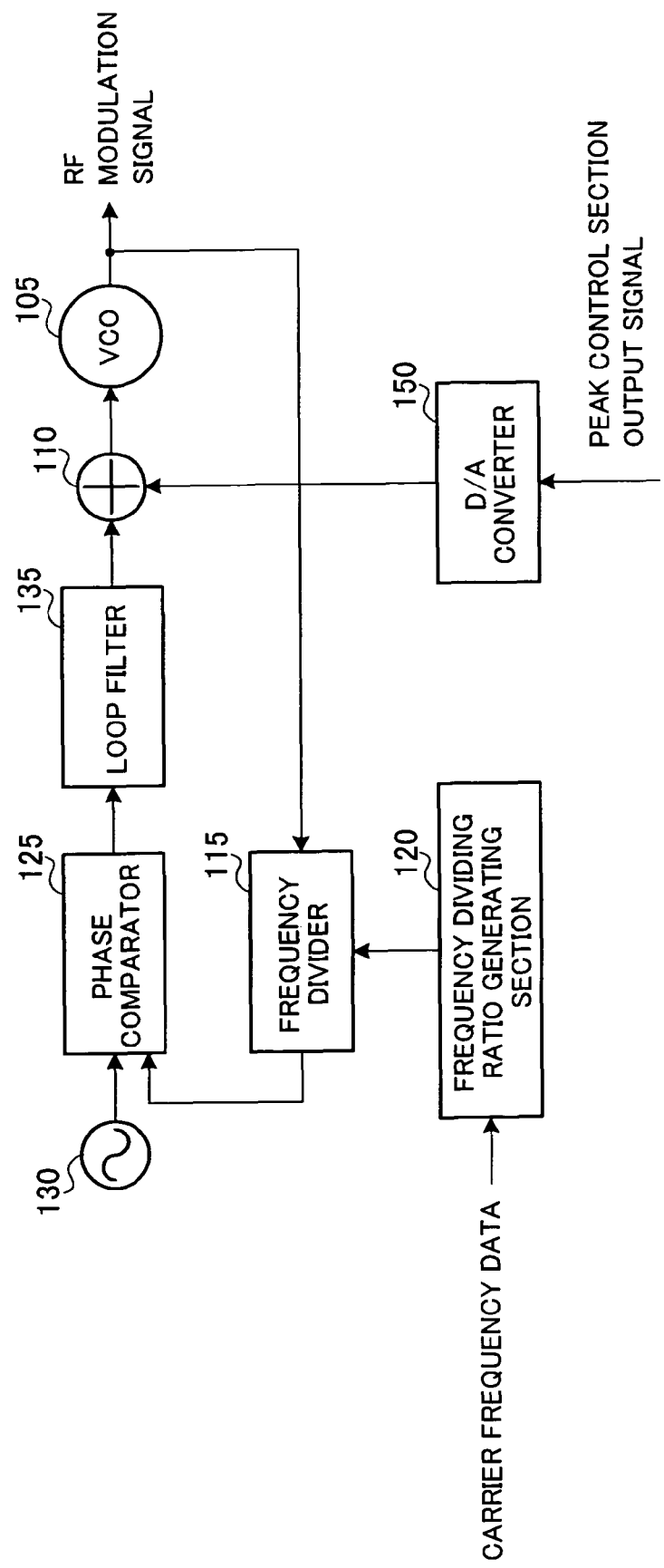
FIG. 10 is a block diagram showing a configuration of a phase modulation section of FIG. 9.

A further example configuration of the phase modulation apparatus is shown in FIG. 9. Phase modulation data is inputted to phase modulation section 102 after passing through peak control section 140. An example configuration of phase modulation section 102 is shown in FIG. 10. The output signal of peak control section 140 is only inputted to D/A converter 150 and is not inputted to frequency dividing ratio generating section 120. The same effects are also obtained for this configuration.

Figure 11:
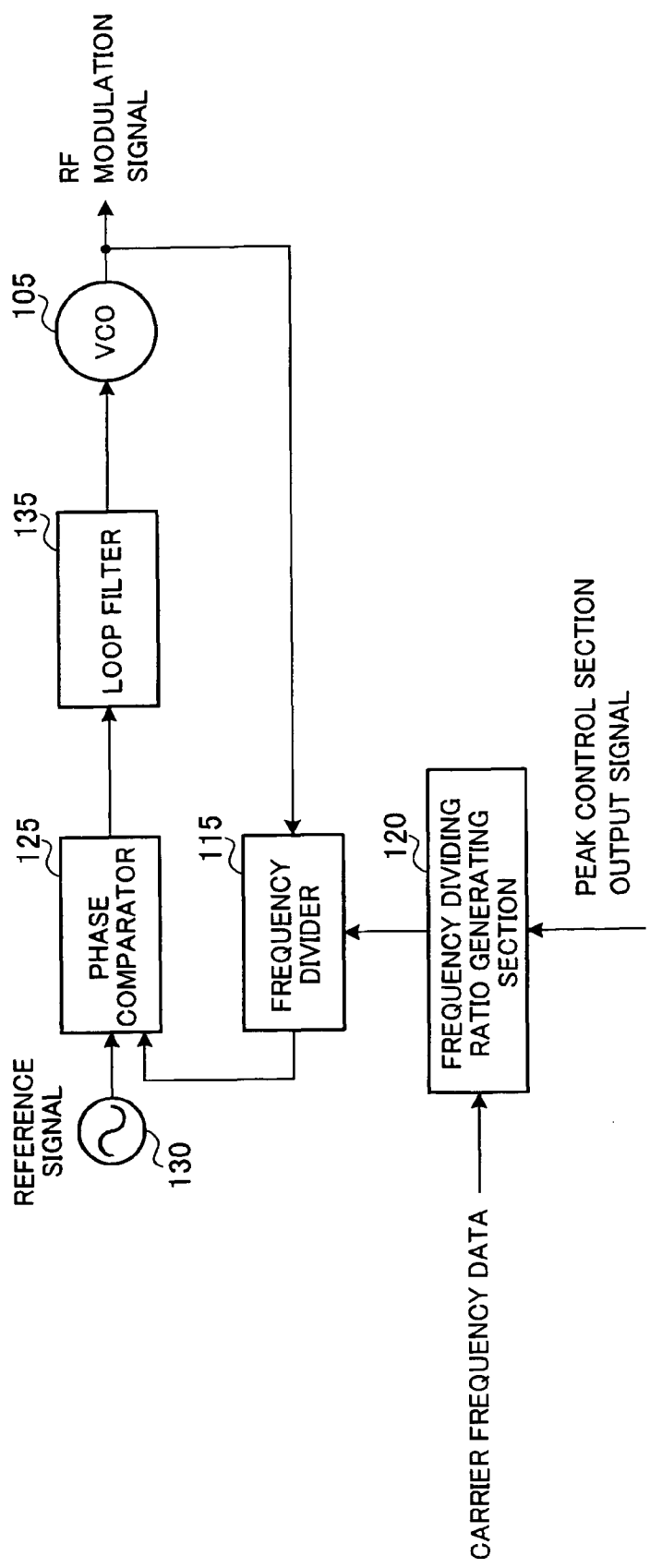
FIG. 11 is a block diagram showing a further configuration of a phase modulation section of FIG. 9.

Further, another example of phase modulation section 102 is shown in FIG. 11. The output signal of peak control section 140 is inputted to frequency dividing ratio generating section 120, and an RF modulation signal is then outputted based on this. In this case, the transmission characteristics deteriorate when the frequency band width of the PLL is not made broader than the frequency bandwidth of the modulation signal. However, when the frequency bandwidth of the PLL is made too broad, other problems occur where noise characteristics deteriorate. Suppressing of peaks is the equivalent of making frequency bandwidth of a modulation signal narrower, and the bandwidth of the PLL can be made narrower by this amount. Namely, there is the advantage that it is possible to apply modulation using one point without substantial deterioration to the transmission characteristics or the noise characteristics.

Further, in the above configuration, modulation takes place by changing the frequency dividing ratio but the modulation is also possible by changing a reference signal.

Embodiment 2

A feature of Embodiment 2 is that at a peak control section, a predetermined threshold value utilized in "smoothing of peak" is changed according to an average value (corresponding to the PLL locked frequency) of the voltage of a VCO input signal.

Figure 12:
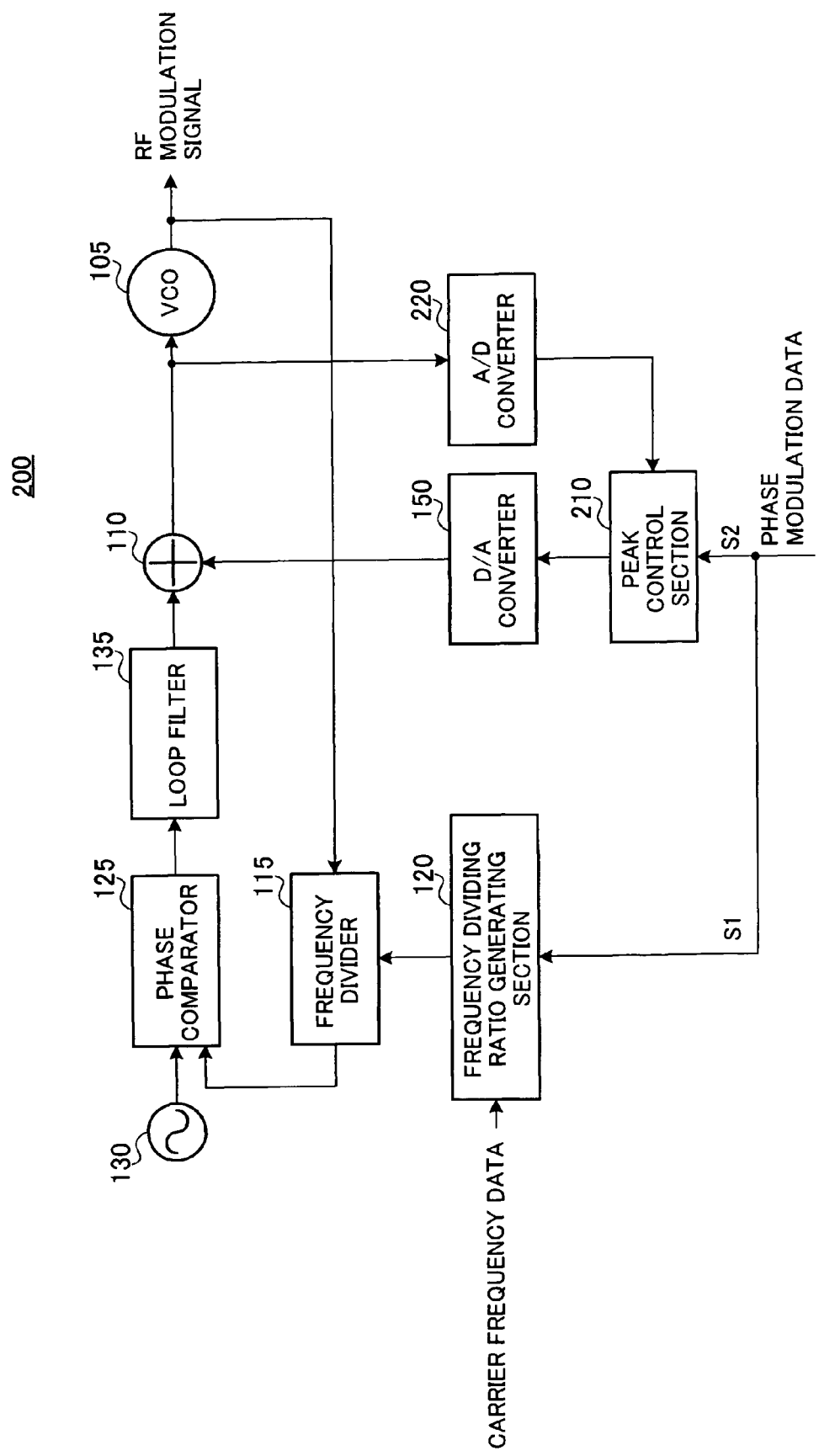
FIG. 12 is a block diagram showing a configuration for a phase modulation apparatus according to Embodiment 2.

Phase modulation apparatus 200 of Embodiment 2 shown in FIG. 12 has peak control section 210 and A/D converter 220.

A/D converter 220 inputs an output signal (namely, input signal to voltage controlled oscillator 105) of adder 110, and converts the analog signal to a digital signal.

As with peak control section 140 of Embodiment 1, peak control section 210 controls peaks by inputting digital baseband signal S2, and smoothing a peak appearing at digital baseband signal S2 that is the phase-modulated data. This "smoothing of the peak" is carried out by moving portions exceeding a predetermined threshold value of the peak portion to a portion less than the threshold value. However, peak control section 210 inputs a digital signal corresponding to the average value (corresponding to the frequency locked for the PLL) of the voltage that is the input signal of voltage controlled oscillator 105 from A/D converter 220, and changes the threshold value utilized in "smoothing of the peak" based on this digital signal.

Figure 13:
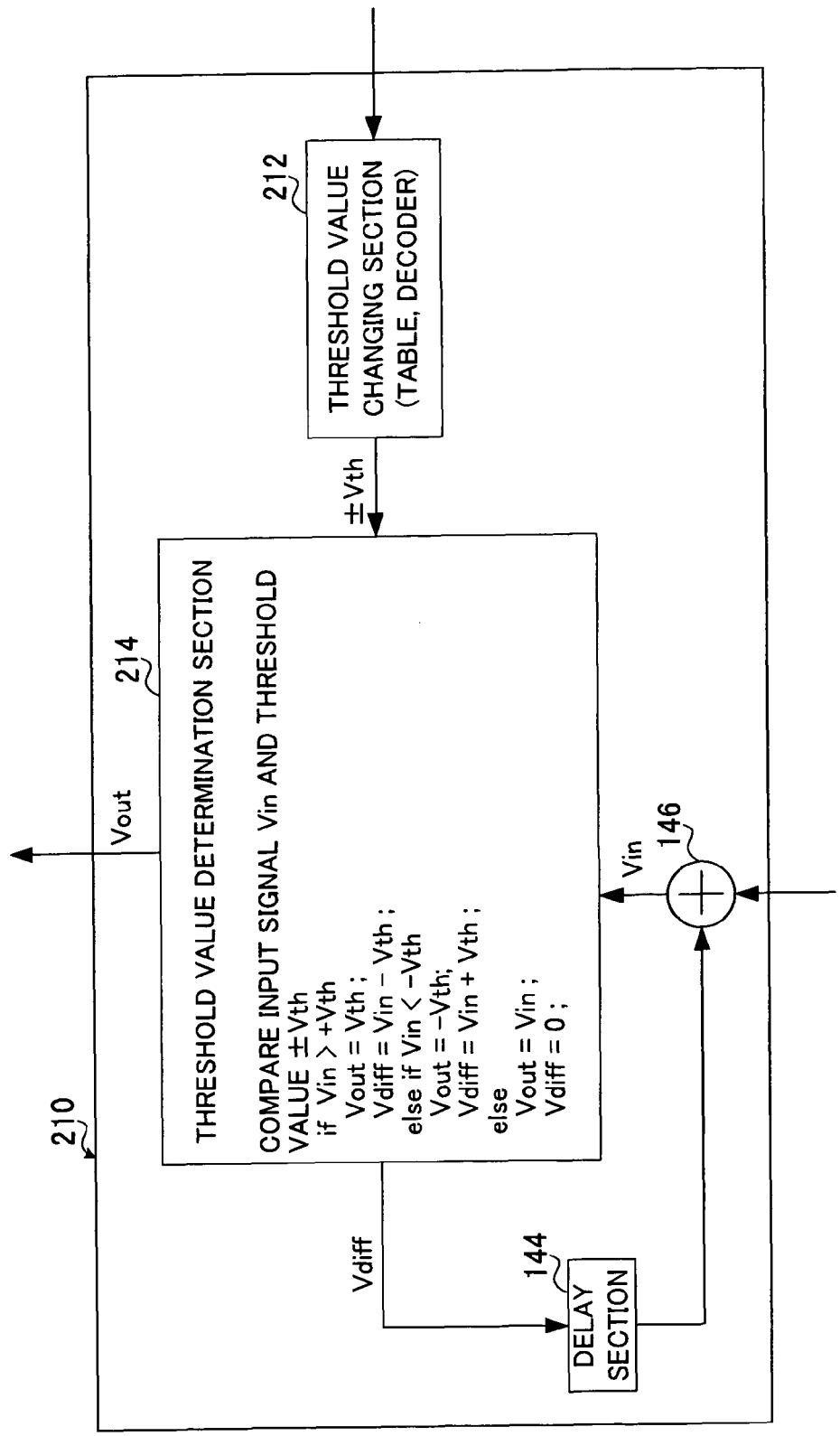
FIG. 13 is a block diagram showing a configuration for a peak control section of FIG. 12.

Specifically, peak control section 210 has threshold value changing section 212 and threshold value determination section 214, as shown in FIG. 13.

Threshold value changing section 212 changes the threshold value utilized in the "smoothing of the peak" according to the average value (hereinafter referred to as "VCO input voltage average value") that is the input signal of voltage controlled oscillator 105. Specifically, threshold value changing section 212 determines whether or not the threshold value is applied to a non-linear region of the VCO sensitivity based on the VCO input voltage average value, and changes the threshold value utilized in "smoothing of the peak" according to the results of this determination.

Namely, when a clearance voltage of a "threshold value initial value" and an average value of the VCO input voltage is larger than a clearance voltage of a boundary voltage of the linear region of the VCO sensitivity and a non-linear region and an average value of the VCO input voltage, threshold value changing section 212 determines that "threshold value initial value" is applied to a non-linear region, and changes the threshold value to less than the clearance voltage between the boundary voltage and the VCO input voltage average value. Further, when the clearance voltage between the "threshold value initial value" and the VCO input voltage average value is less than the clearance voltage between a boundary voltage between a linear region and a non-linear region of VCO sensitivity and a VCO input voltage average value, threshold value changing section 212 determines not to apply the "threshold value initial value" to a non-linear region, namely determines this to be in a linear region, and takes the threshold value as "threshold value initial value". Here, "threshold value initial value" is a maximum value that can be taken for a threshold value, and corresponds to a number of bits permitted for the quantized bit string that is inputted to D/A converter 150 while striking a balance with circuit scale. Further, threshold value changing section 212 is configured from a table and decoder, and changing of the table using software is also possible.

Threshold value determination section 214 inputs a threshold value for after changing from threshold value changing section 212, and carries out the same operation as threshold value determination section 142 in Embodiment 1 using this threshold value.

Next, the details of the function of peak control section 210 will be described with reference to FIG. 14. FIG. 14A shows an aspect of an input signal to peak control section 210, an output signal, and a VCO output signal. Further, FIG. 14B shows fluctuation with time of phase fluctuation speed corresponding to the output signal of peak control section 210 shown in FIG. 14A.

The threshold value shown in FIG. 14A is set to Th1000 and Th1100, and when "VCO input voltage average value" is in the vicinity of the boundary voltage of the linear region and non-linear region as shown in the same drawing, even if "smoothing of the peak" is carried out using Th1000 and Th1100, the input voltage applied to the VCO of the output signal of peak control section 210 is applied to a non-linear region, namely the frequency of the output signal of the VCO is applied to an on-linear region. This results in lower modulation precision.

The threshold value applied to the non-linear region (in the same drawing, Th1000) is then changed to a threshold value (Th1200 in the same drawing) corresponding to a clearance voltage between the boundary voltage and the VCO input voltage value.

Phase fluctuation speed that is an output signal of peak control section 210 for after "smoothing of the peak" is carried out using the threshold value corresponding to the threshold value (Th1200 in the same drawing) for after changing is shown in FIG. 14B. As shown in the same drawing, threshold value is changed to threshold value Th1300 (−0.8 Rad) corresponding to Th1200 so that the frequency of the VCO output signal is not applied to the non-linear region. The threshold value Th1100 is within a linear region, and the threshold value Th1400 corresponding to this threshold value Th1100 therefore remains as the initial value (1 Rad).

By changing the threshold value adaptively using "smoothing of the peak" according to the "VCO input voltage average value", it is possible to prevent the frequency of the VCO output signal from being applied to the non-linear region, improve modulation precision, and reduce circuit scale.

According to Embodiment 2, D/A converter 150 for converting the inputted digital baseband signal to an analog signal, adder 110 for adding the output signal of D/A converter 150 and the output of loop filter 135 of the PLL circuit, and outputting the addition signal to the control voltage terminal of voltage controlled oscillator 105 and peak control section 210 for carrying out smoothing of peak portions appearing in the inputted digital baseband signal provided at the front stage of D/A converter 150 are provided at phase modulation apparatus 200 for modulating the carrier frequency signal using the inputted digital baseband modulation signal by setting a frequency dividing ratio of frequency divider 115 of the PLL circuit based on an inputted digital baseband modulation signal, and adding a voltage corresponding to a signal that is the inputted digital baseband signal analog-converted for supply to a control voltage terminal of voltage controlled oscillator 105 of the PLL circuit. For example, peak control section 210 carries out smoothing of the peak portions by moving portions of the peak portions exceeding a predetermined threshold value to portions less than the predetermined threshold value after the appearance of the peak portion.

Further, at phase modulation apparatus 200, threshold value changing section 212 for changing the threshold value according to the average voltage supplied to the control voltage terminal (VCO input voltage average value) is provided, and peak control section 210 carries out smoothing of the peak portion using the threshold value after changing.

By doing this, boundary voltages of the non-linear region and linear region of voltage controlled oscillator 105 are known. That means the distance from the average voltage supplied to the control voltage terminal (VCO input voltage average value) to the boundary voltage of the non-linear region and linear region of voltage controlled oscillator 105 is therefore known and this distance may constitute an index indicating ease of application to a non-linear region of the output signal of voltage controlled oscillator 105. Therefore, it is possible to prevent the frequency of the output signal of voltage controlled oscillator 105 from being applied to a non-linear region and improve modulation precision by changing the threshold value according to average voltage (VCO input voltage average value) supplied to the control voltage terminal.

Upon determining whether or not the threshold value enters a non-linear region of the voltage controlled oscillator based on the average voltage supplied, the threshold value, and the boundary voltage of the non-linear region and the linear region, and when it is determined that the non-linear region has been entered, threshold value changing section 212 changes the threshold value to be less than the clearance voltage between the boundary voltage and the average voltage supplied.

By doing this, when it is determined that the non-linear region has been entered (the frequency of the output signal of voltage controlled oscillator 105 is applied to a non-linear region), the threshold value may be changed to be less than the clearance voltage between the boundary voltage and the average voltage supplied so that it is possible to reliably prevent the frequency of the output signal of voltage controlled oscillator 105 from being applied to the non-linear region, and improve modulation precision.

Embodiment 3

A feature of Embodiment 3 is that the predetermined threshold value utilized in "smoothing of the peak" at the peak control section is changed according to temperature fluctuations.

Figure 15:
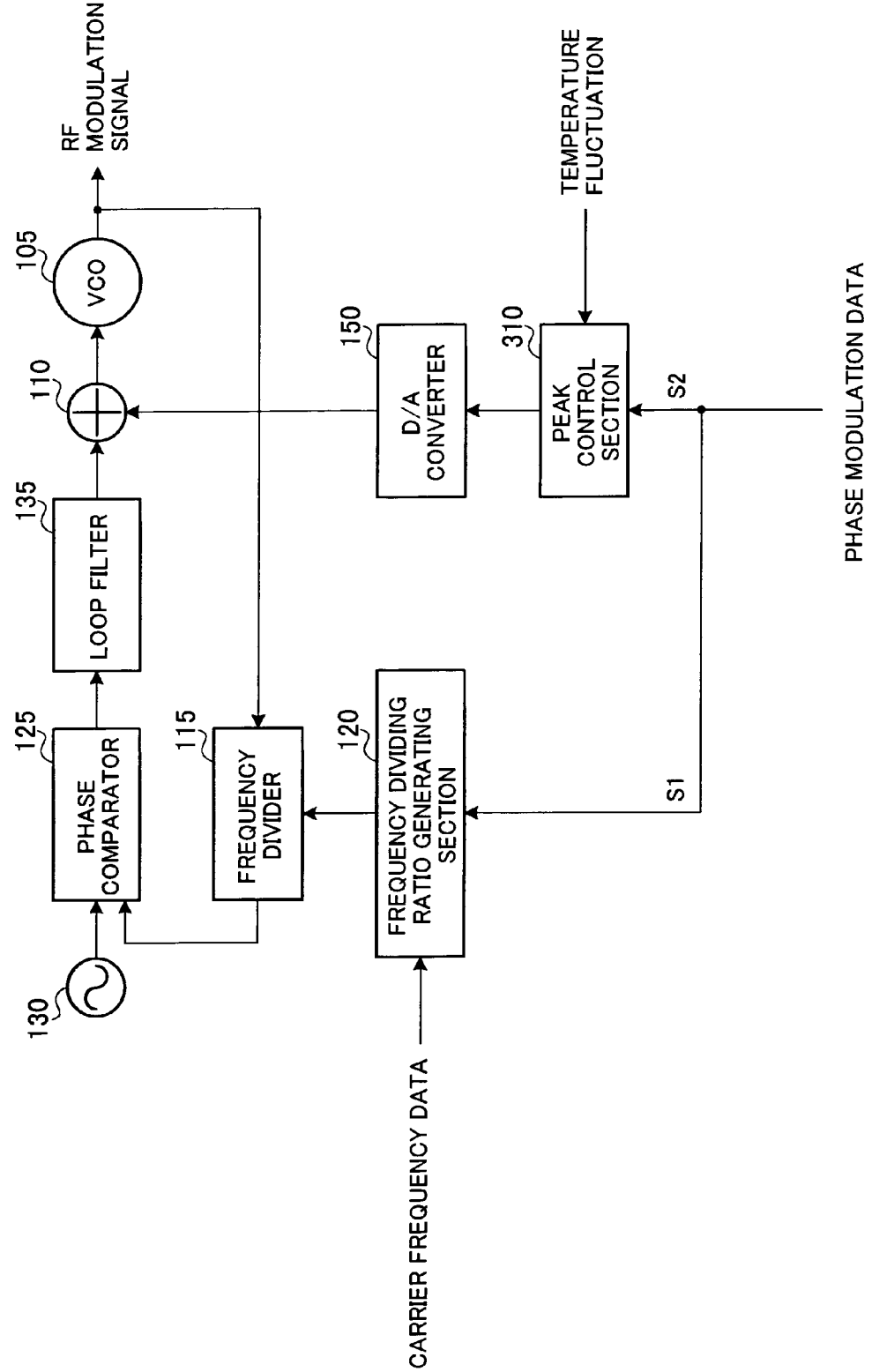
FIG. 15 is a block diagram showing a configuration for a phase modulation apparatus according to Embodiment 3.

Phase modulation apparatus 300 of Embodiment 3 shown in FIG. 15 has peak control section 310.

Peak control section 310 carries out "smoothing of the peak" upon inputting temperature information and changing the predetermined threshold value according to temperature fluctuations.

Figure 16:
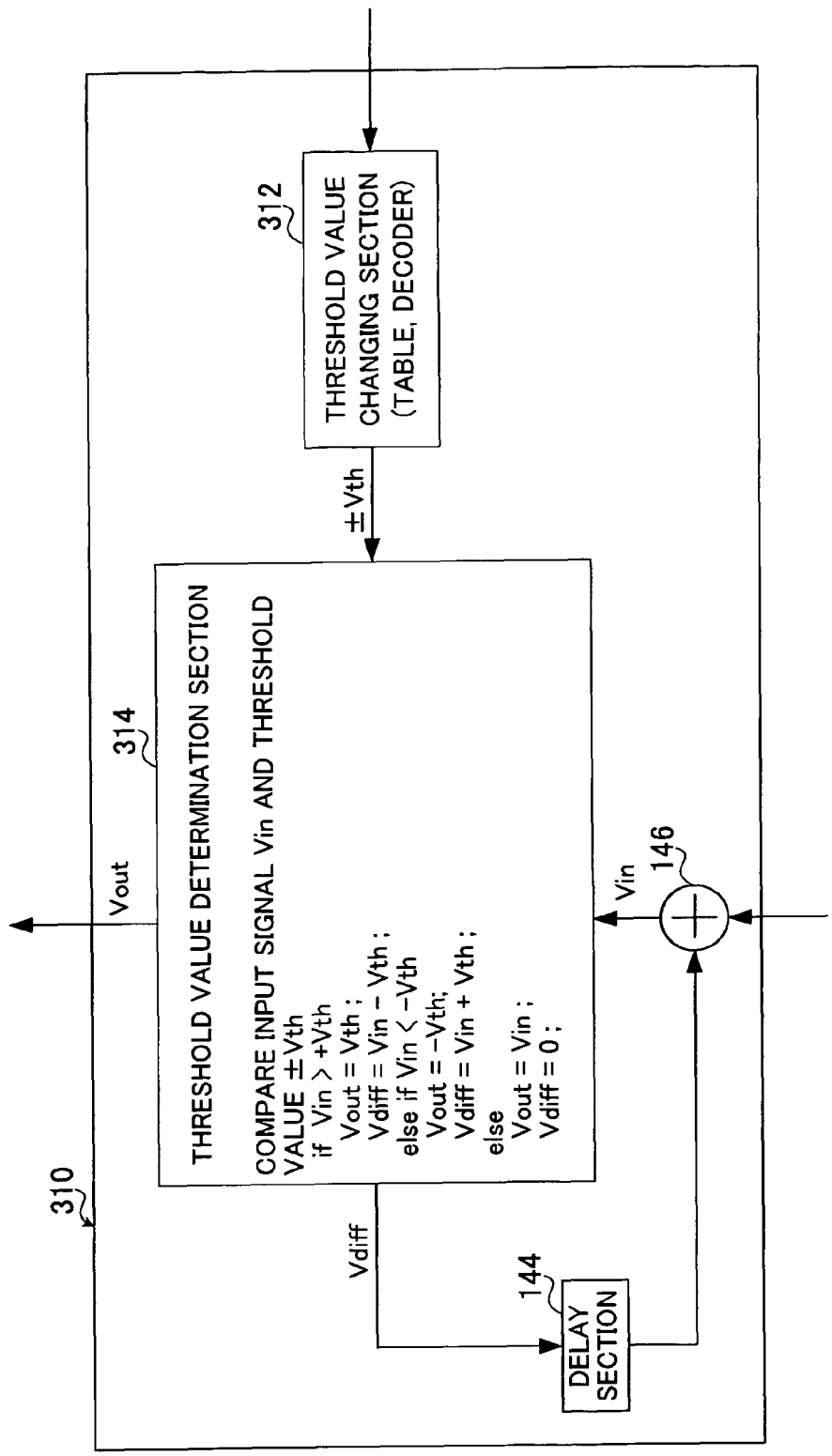
FIG. 16 is a block diagram showing a configuration for a peak control section of FIG. 15.

Specifically, peak control section 310 has threshold value changing section 312 and threshold value determination section 314 as shown in FIG. 16. This threshold value changing section 312 maintains a corresponding relationship between temperature (for example, air temperature, temperature of VCO 150) and the threshold value, and outputs a threshold value corresponding to the inputted temperature information. Further, threshold value changing section 312 is configured from a table and decoder, and changing of the table using software is also possible.

Threshold value determination section 314 inputs a threshold value for after changing from threshold value changing section 312, and carries out the same operation as threshold value determination section 142 in Embodiment 1 using this threshold value.

Next, the function of peak control section 310 will be described.

Figure 1:
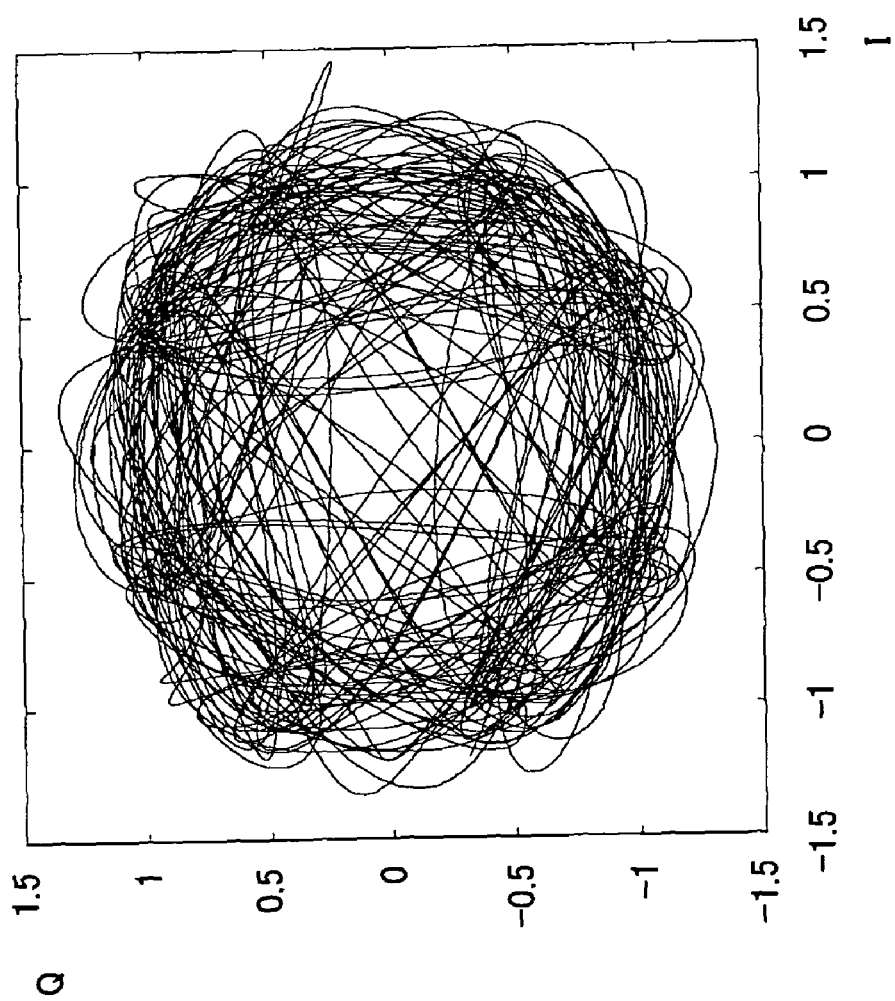
FIG. 1 shows an HPSK IQ constellation.
Figure 2A:
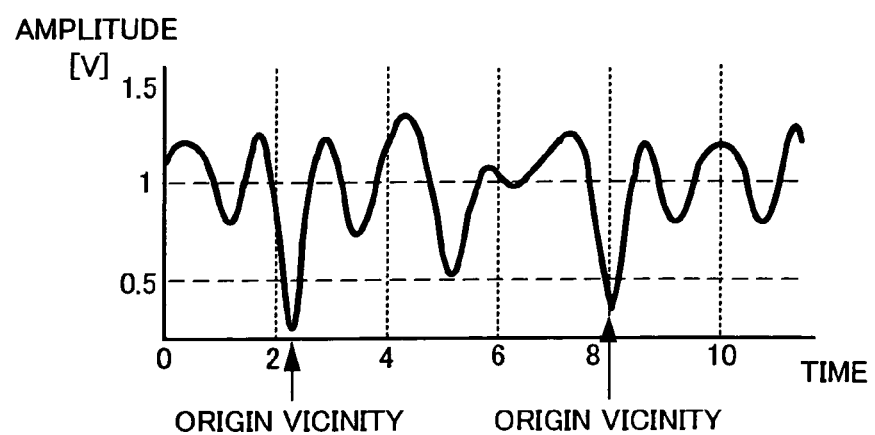
FIG. 2 is a diagram illustrating fluctuation with time of a phase signal inputted to a VCO and a VCO input voltage.
Figure 2B:
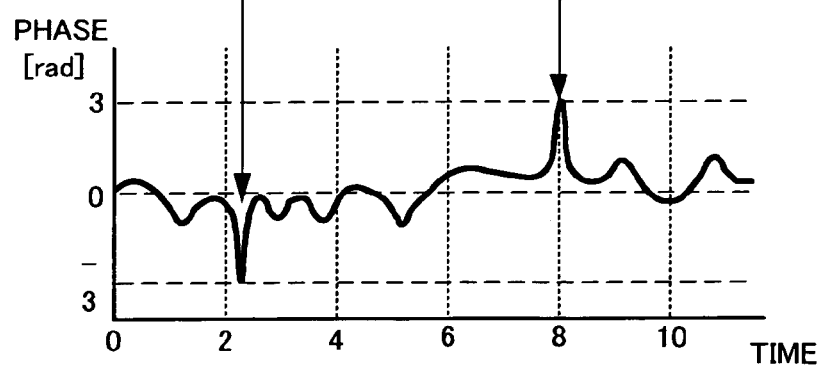

When a temperature fluctuation occurs, changes in the relationship between the input and output of VCO 105 occur. Specifically, the inclination of the linear portion of the curve for the relationship between the input and output of VCO 105 shown in FIG. 2 fluctuates. Further, the boundary point (boundary voltage) between the linear region and then on-linear region both change.

Here, peak control section 310 maintains a correspondence relationship with the threshold value beforehand so that the frequency of the output signal of VCO 105 is not applied to a non-linear region every temperature, and "smoothing of the peak" is carried out using a threshold value applicable for a temperature indicated by the inputted information. By doing this, it is possible to prevent the frequency of the output signal of VCO 105 from being applied to a non-linear region, improve modulation precision, and reduce circuit scale.

According to Embodiment 3, D/A converter 150 for converting the inputted digital baseband signal to an analog signal, adder 110 for adding the output signal of D/A converter 150 and the output of loop filter 135 of the PLL circuit, and outputting the addition signal to the control voltage terminal of voltage controlled oscillator 105, and peak control section 310 for carrying out smoothing of peak portions appearing in the inputted digital baseband signal provided at the front stage of D/A converter 150 are provided at phase modulation apparatus 300 for modulating the carrier frequency signal using the inputted digital baseband modulation signal by setting a frequency dividing ratio of frequency divider 115 of the PLL circuit based on an inputted digital baseband modulation signal, and adding a voltage corresponding to a signal that is the inputted digital baseband signal analog-converted for supply to a control voltage terminal of voltage controlled oscillator 105 of the PLL circuit. For example, peak control section 310 carries out smoothing of the peak portions by moving portions of the peak portions exceeding a predetermined threshold value to portions less than the predetermined threshold value after the appearance of the peak portion.

Further, at phase modulation apparatus 300, threshold value changing section 312 for changing the threshold value according to temperature information is provided, and peak control section 310 carries out smoothing of the peak portions using a threshold value after the changing.

By doing this, it is possible to change the threshold value in line with temperature even if the sensitivity of voltage controlled oscillator 105 fluctuates due to temperature fluctuations so that it is possible to prevent the frequency of the output signal of VCO 150 from being applied to a non-linear region, and improve modulation precision.

Embodiment 4

A feature of Embodiment 4 is that at the peak control section, a predetermined threshold value utilized in "smoothing of peak" is changed according to an average value (corresponding to the PLL locked frequency) of the voltage of a VCO input signal and temperature fluctuations.

Figure 17:
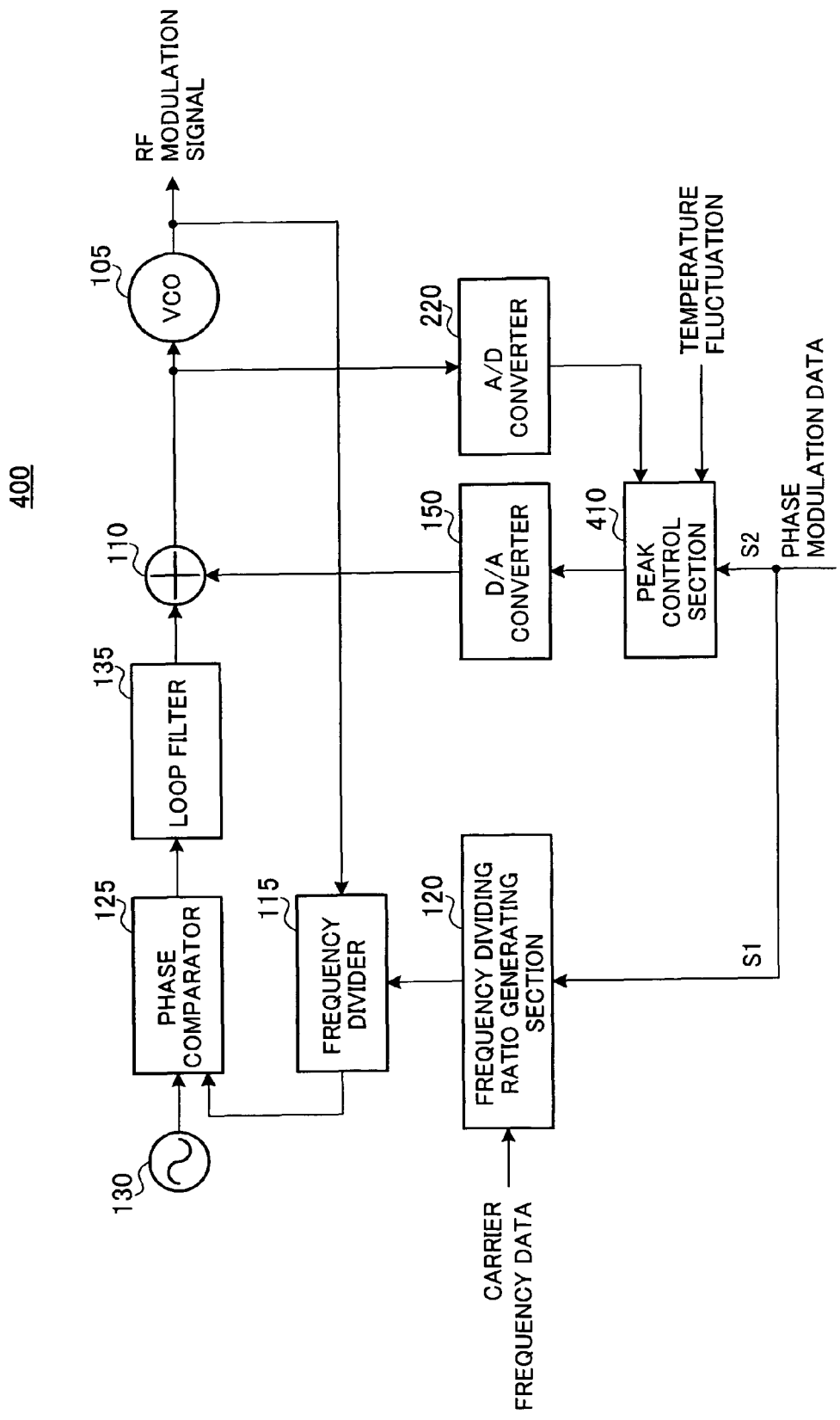
FIG. 17 is a block diagram showing a configuration for phase modulation apparatus according to Embodiment 4.

Phase modulation apparatus 400 of Embodiment 4 shown in FIG. 17 has peak control section 410.

As with peak control section 210 of Embodiment 2, peak control section 410 controls peaks by inputting digital baseband signal S2, and carrying out smoothing of peak appearing at digital baseband signal S2 that is the phase modulated data. However, peak control section 410 inputs a digital signal corresponding to the average value (namely, corresponding to the frequency locked for the PLL) of the voltage that is the input signal of voltage controlled oscillator 105 from A/D converter 220, further inputs temperature information, and changes the threshold value utilized in "smoothing of the peak" based on this digital signal and temperature information.

Figure 18:
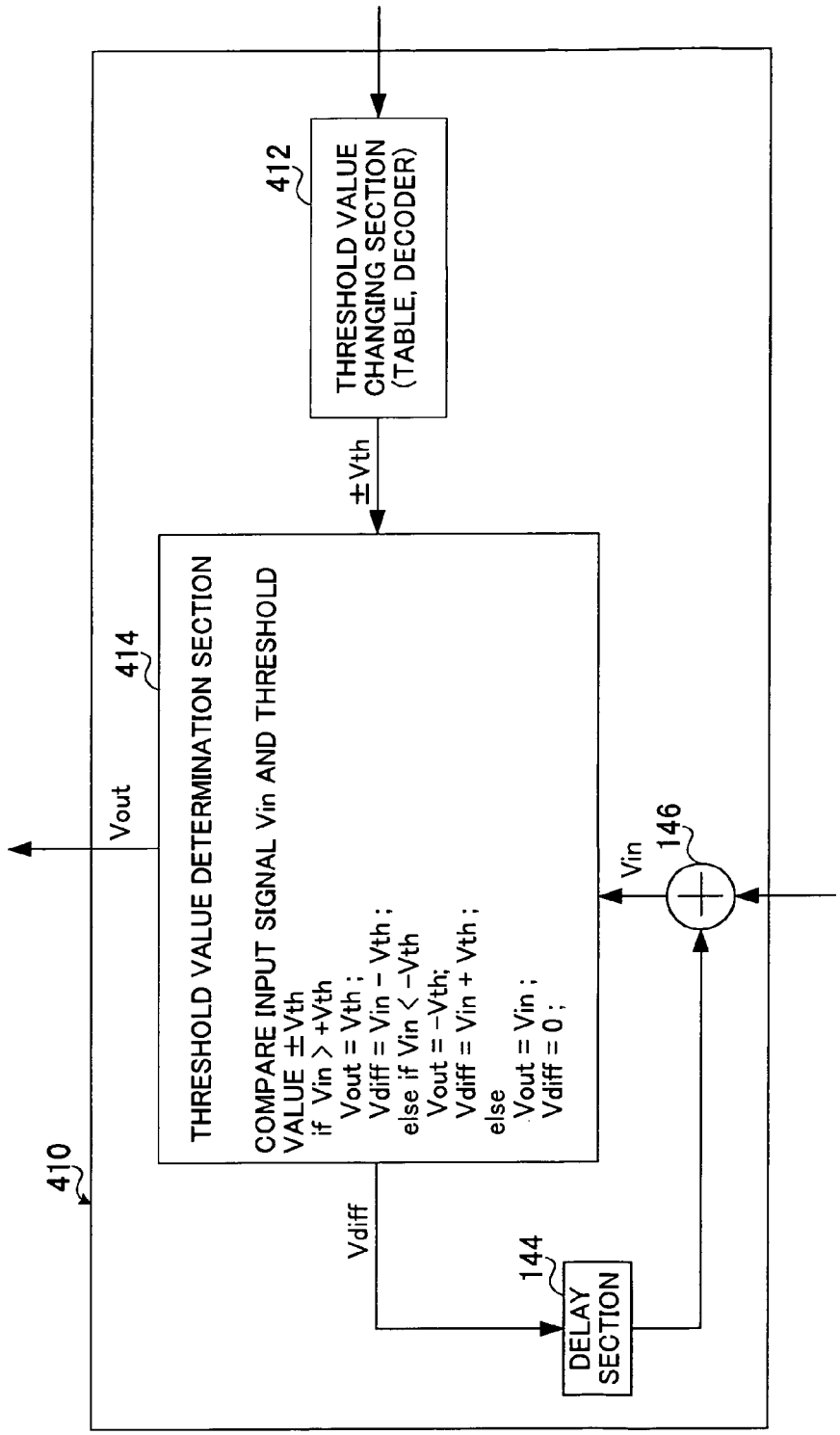
FIG. 18 is a block diagram showing a configuration for a peak control section of FIG. 17.

Specifically, peak control section 410 has threshold value changing section 412 and threshold value determination section 414, as shown in FIG. 18.

Threshold value changing section 412 changes the threshold value utilized in "smoothing of the peak" according to the average value of the VCO input voltage and the temperature information. Specifically, threshold value changing section 412 changes the boundary voltage between the linear region and non-linear region according to temperature indicated in the temperature information and carries out the same operation as threshold value changing section 212 of Embodiment 2 using the modified boundary voltage and VCO input voltage average value.

For example, when the clearance voltage of the "threshold value initial value" and the average value of the VCO input voltage is larger than the clearance voltage of "the boundary voltage after changing" corresponding to the temperature information and the average value of the VCO input voltage, threshold value changing section 412 determines that "threshold value initial value" is applied to the non-linear region, and changes the threshold value according to the clearance voltage between the "boundary voltage after changing" and the VCO input voltage average value.

According to Embodiment 4, D/A converter 150 for converting the inputted digital baseband signal to an analog signal, adder 110 for adding the output signal of D/A converter 150 and the output of loop filter 135 of the PLL circuit, and outputting the addition signal to the control voltage terminal of voltage controlled oscillator 105, and peak control section 410 for carrying out smoothing of peak portions appearing in the inputted digital baseband signal provided at the front stage of D/A converter 150 are provided at phase modulation apparatus 400 for modulating the carrier frequency signal using the inputted digital baseband modulation signal by setting a frequency dividing ratio of frequency divider 115 of the PLL circuit based on an inputted digital baseband modulation signal, and adding a voltage corresponding to a signal that is the inputted digital baseband signal analog-converted for supply to a control voltage terminal of voltage controlled oscillator 105 of the PLL circuit. For example, peak control section 410 carries out smoothing of the peak portions by moving portions of the peak portions exceeding a predetermined threshold value to portions less than the predetermined threshold value after the appearance of the peak portion.

Further, at phase modulation apparatus 400, threshold value changing section 412 for changing the threshold value according to the average voltage supplied to the control voltage terminal (VCO input voltage average value) is provided, and peak control section 410 carries out smoothing of the peak portion using the threshold value after changing. Upon changing the boundary voltage of the non-linear region and the linear region according to the temperature information, and determining whether or not the threshold value enters a non-linear region of the voltage controlled oscillator based on the average supplied voltage and the boundary voltage of the threshold value and after changing, and when the threshold value enters the non-linear region, threshold value changing section 412 changes the threshold value to be less than or equal to the clearance voltage of the boundary voltage after changing and the average supplied voltage.

By doing this, it is possible to change the threshold value in line with the temperature and the average voltage supplied to the control voltage terminal (average value of VCO input voltage), so that it is possible to prevent the frequency of the output signal of VCO 150 from being applied to the non-linear region, and improve modulation precision.

Embodiment 5

In Embodiments 1 to 4, "smoothing of peak" is carried out using sample points from the time of appearance of peaks onwards. In this respect, a feature of Embodiment 5 is to carry out "smoothing of the peak" using sample points for before the appearance of peaks. Here, a case will be described where this feature is applied to Embodiment 1.

Figure 19:
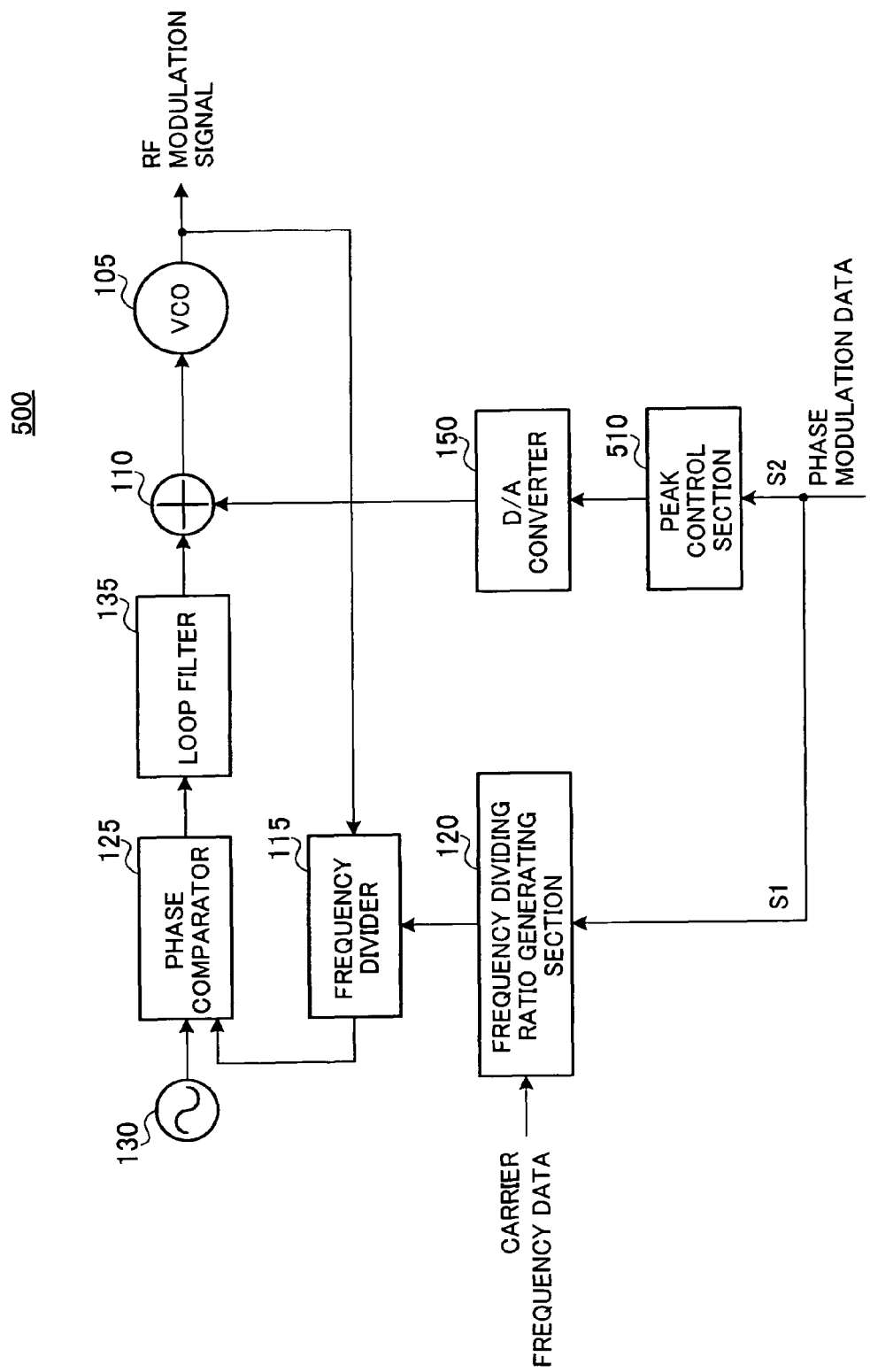
FIG. 19 is a block diagram showing a configuration for a phase modulation apparatus according to Embodiment 5.

As shown in FIG. 19, phase modulation apparatus 500 has peak control section 510.

As with peak control section 140 of Embodiment 1, peak control section 510 controls peaks by inputting digital baseband signal S2, and smoothing a peak appearing at digital baseband signal S2 that is the phase-modulated data as described above. However, peak control section 510 carries out processing so as to distribute portions exceeding the predetermined threshold value of the peak portion to portions less than the threshold value occurring at a time band before the appearance of a peak under the limitation of reaching the threshold value.

Figure 20:
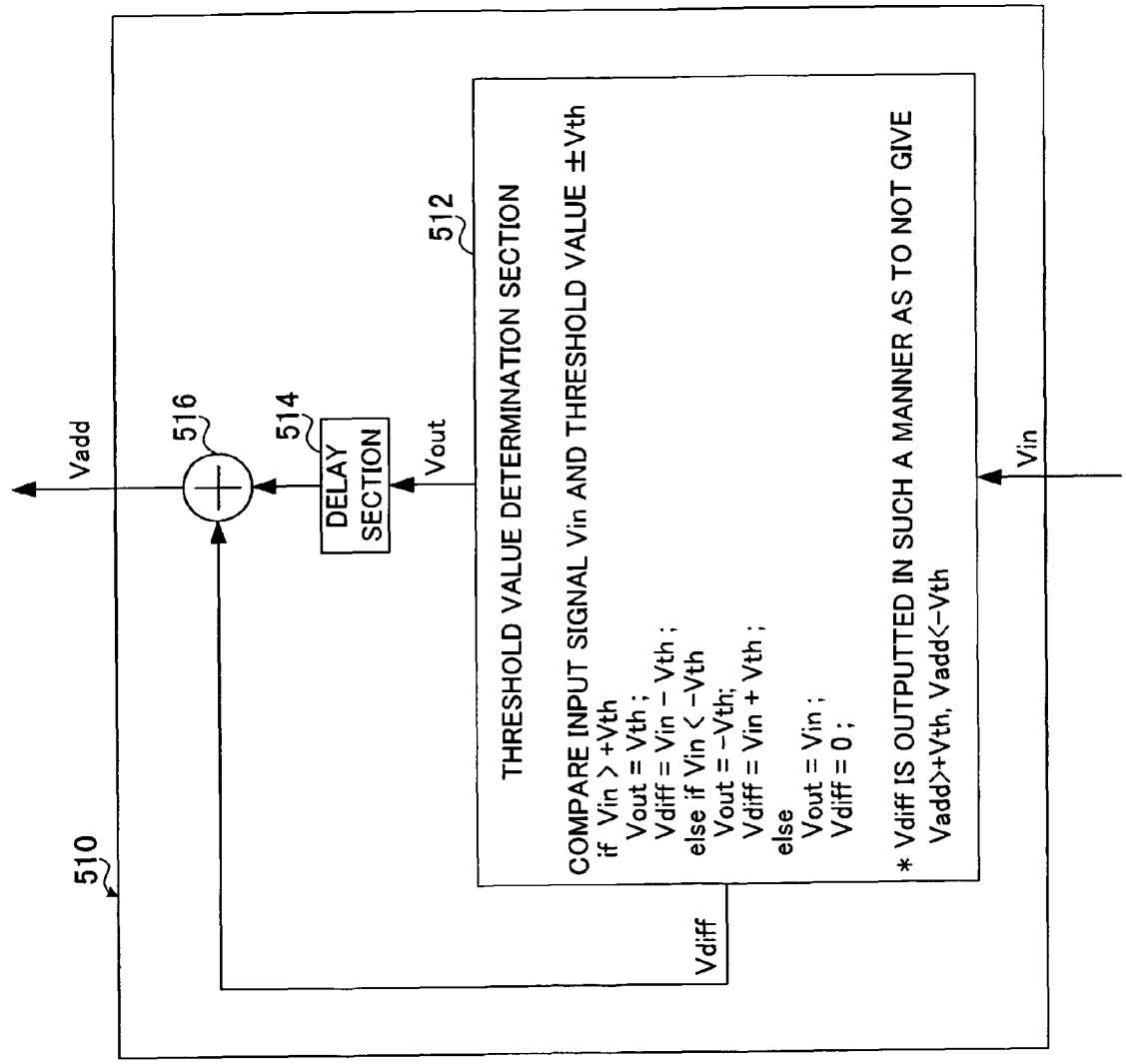
FIG. 20 is a block diagram showing a configuration for a peak control section of FIG. 19.

Specifically, peak control section 510 is configured from threshold value determination section 512, delay section 514, and adding section 516 as shown in FIG. 20.

Threshold value determination section 512 makes a threshold value determination using predetermined threshold value (Vth) on phase fluctuation speed (Vin) denoted by inputted quantized bit strings at each sample timing. When the phase fluctuation speed (Vin) of an inputted quantized bit string exceeds a predetermined threshold value (Vth), the portion exceeding the predetermined threshold value (Vth) of the phase fluctuation speed (Vin) denoted by the inputted quantized bit string, namely a differential bit string that is a differential (Vin−Vth=Vdiff) of phase fluctuation speed (Vin) and the predetermined threshold value (Vth) quantized is outputted to adding section 516, and a quantized bit string that is the phase fluctuation speed corresponding to the predetermined threshold value (Vth) is outputted to delay section 514. Further, as a result of the determination, when the phase fluctuation speed (Vin) denoted by the inputted quantized bit string is less than or equal to the predetermined threshold value (Vth) threshold value determination section 512 outputs the inputted quantized bit string to delay section 514.

Delay section 514 delays outputted bit string (Vout) from threshold value determination section 512 by just a predetermined delay time and outputs this to adding section 516. This delay time is a time corresponding to whether or not to carry out smoothing of the peak using samples occurring several previous sample timings, and is constituted by integral multiples of the sample timing interval.

Adding section 516 inputs a signal where the outputted bit string (Vout) of threshold value determination section 512 is delayed by a predetermined time and a differential quantized bit string from threshold value determination section 512, adds both bit strings, and outputs the added quantized bit string to D/A converter 150 as the inputted quantized bit string. Here, "adds" means generating a quantized bit string corresponding to the addition speed when phase fluctuation speed denoted by the outputted bit string (Vout) and the phase fluctuation speed denoted by the differential quantized bit string are added.

At peak control section 510, the quantized bit string outputted by the peak control section is subjected to "smoothing of the peak" by moving the peak portion of the phase fluctuation speed exceeding the predetermined threshold value to a sample point less than the predetermined threshold value for before the appearance of the peak. The same results as for Embodiment 1 are then obtained.

The feature of this embodiment may also be applied to Embodiments 2 to 4.

According to Embodiment 5, D/A converter 150 for converting the inputted digital baseband signal to an analog signal, adder 110 for adding the output signal of D/A converter 150 and the output of loop filter 135 of the PLL circuit, and outputting the addition signal to the control voltage terminal of voltage controlled oscillator 105, and peak control section 510 for carrying out smoothing of peak portions appearing in the inputted digital baseband signal provided at the front stage of D/A converter 150 are provided at phase modulation apparatus 500 for modulating the carrier frequency signal using the inputted digital baseband modulation signal by setting a frequency dividing ratio of frequency divider 115 of the PLL circuit based on an inputted digital baseband modulation signal, and adding a voltage corresponding to a signal that is the inputted digital baseband signal analog-converted for supply to a control voltage terminal of voltage controlled oscillator 105 of the PLL circuit. For example, peak control section 510 carries out smoothing of the peak portions by moving portions of the peak portions exceeding a predetermined threshold value to portions less than the predetermined threshold value for before the appearance of the peak portion.

Embodiment 6

Figure 21:
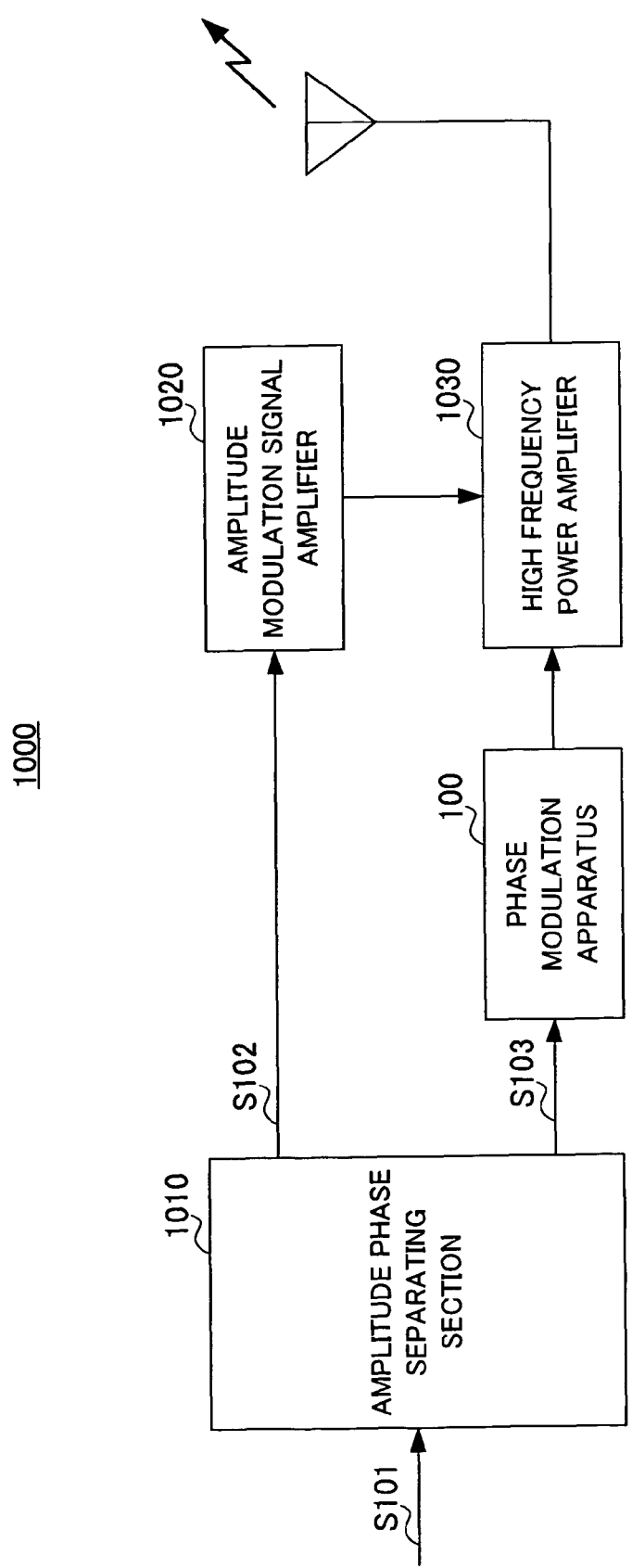
FIG. 21 is a block diagram showing a configuration for a polar modulation transmission apparatus according to Embodiment 6.
Figure 22:
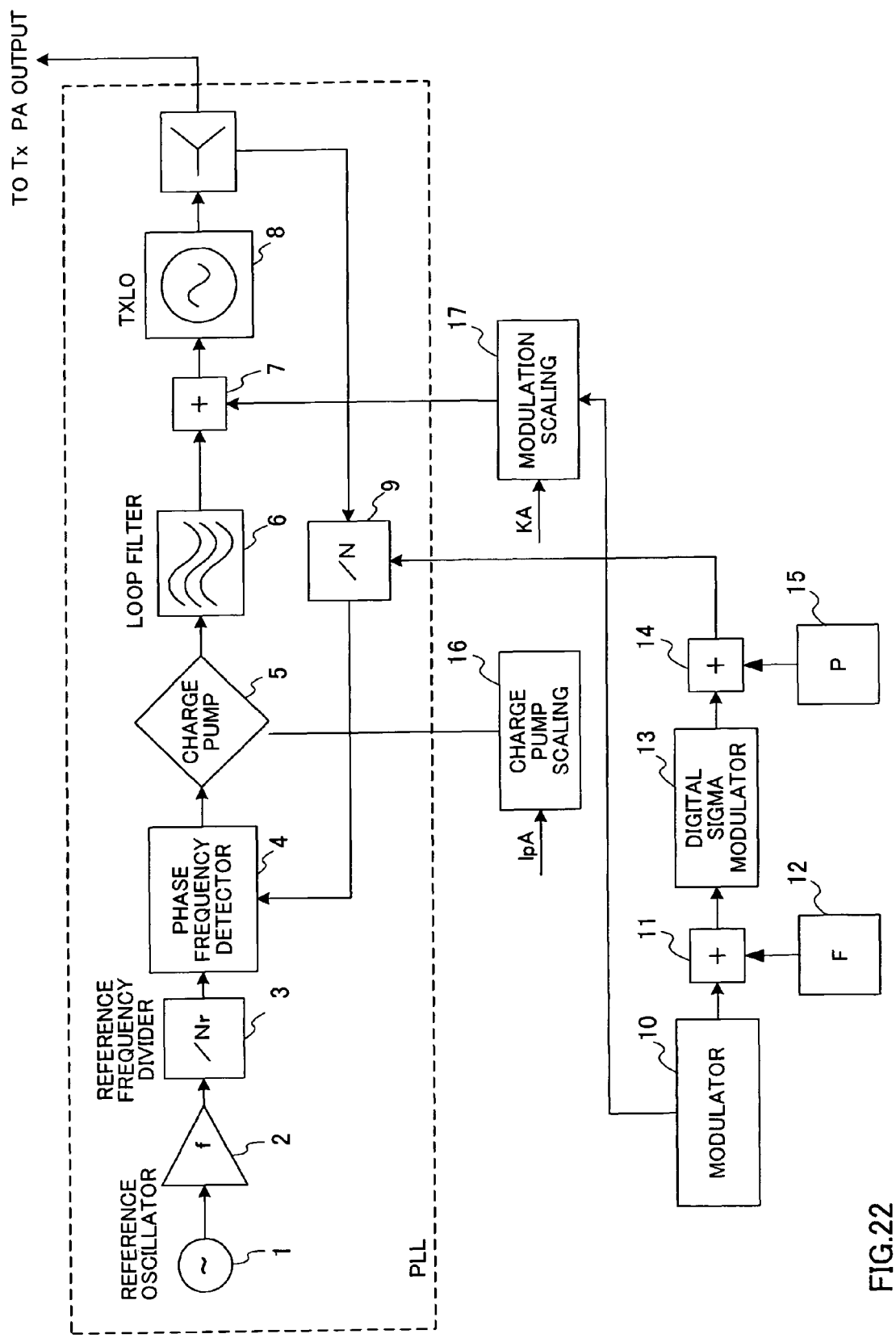
FIG. 22 is a block diagram showing configuration for phase modulation apparatus using a broad band modulation PLL adopting this proposed two point modulation method of the related art.

A configuration for a polar modulation transmission apparatus using the phase modulation apparatus of the present invention is shown in FIG. 21. Amplitude phase separating section 1010 inputs baseband modulation signal S101 composed of an I (in-phase) component and Q (orthogonal) component. Amplitude phase separating section 1010 outputs the amplitude component (i.e. $\sqrt{(I^2+Q^2)}$) of baseband modulation signal S101 to amplitude modulation signal amplifier 1020 as amplitude modulation signal S102, and transmits the phase component (for example, an angle spanned by a modulation symbol and an I axis) of baseband modulation signal S101 to phase modulation apparatus 100 (200, 300, 400 and 500) as baseband phase modulation signal S103.

Digital baseband signal S1 (S2) converted from baseband phase modulation signal S103 is inputted at phase modulation apparatus 100.

Polar modulation transmission apparatus 1000 modulates a carrier wave signal (carrier frequency data) using modulation apparatus 100 (200, 300, 400 and 500) of Embodiments 1 to 5 using a baseband phase modulation signal (digital baseband signal S1(S2)), and outputs an RF phase modulation signal (high-frequency phase modulation signal) obtained in this manner to high frequency power amplifier 1030.

High frequency power amplifier 1030 is configured using a non-linear amplifier, with a power supply voltage value being set according to an amplitude modulation signal amplified by amplitude modulation signal amplifier 1020. As a result, a transmission signal is outputted where a signal that is an RF modulation signal outputted by phase modulation apparatus 100 multiplied with the power supply voltage value amplified by just the gain of high frequency power amplifier 1030. This transmission signal is then transmitted from an antenna. At polar modulation transmission apparatus 1000, an RF modulation signal inputted to high frequency power amplifier 1030 can be taken to be a constant-envelope signal not having a fluctuating component in an amplitude direction, so that a highly efficient non-linear amplifier can be used as high frequency power amplifier 1030.

At polar modulation transmission apparatus 1000, it is possible to achieve low power consumption by using phase modulation apparatus 100 (200, 300, 400 and 500) of Embodiments 1 to 5 capable of reducing circuit scale while maintaining modulation precision by carrying out "smoothing of the peak". As a result, for example, in the case of mounting on a mobile terminal, it is possible to implement a small mobile terminal where usage over long periods of time is possible.

The present invention is not limited to the above-described embodiments, and various variations and modifications may be possible without departing from the scope of the present invention.

This application is based on the U.S. Provisional Application No. 60/735,173 filed on Nov. 10, 2005, entire content of which is expressly incorporated by reference herein.

What is claimed is:

1. A two-point modulation type phase modulation apparatus for modulating a carrier frequency signal using an inputted digital baseband modulation signal by setting a frequency dividing ratio of a frequency divider of a PLL circuit based on the inputted digital baseband modulation signal, and adding a voltage corresponding to an analog-converted signal to the inputted digital baseband signal for supply to a control voltage terminal of a voltage controlled oscillator of the PLL circuit, comprising:
    a D/A converter that converts the inputted digital baseband signal to an analog signal;
    an adding section that adds an output signal of the D/A converter and an output of a loop filter of the PLL circuit, and outputs the addition signal to the control voltage terminal of the voltage controlled oscillator; and
    a peak control section provided at a front stage of the D/A converter, that carries out smoothing of peak portions appearing in the inputted digital baseband signal.

2. The two-point modulation type phase modulation apparatus according to claim 1, wherein the peak control section carries out smoothing of the peak portions by moving portions of the peak portions exceeding a predetermined threshold value to portions less than the predetermined threshold value after the appearance of the peak portion.

3. The two-point type phase modulation apparatus according to claim 2, wherein:
    the peak control section comprises:
    an adding section that adds a phase fluctuation speed signal denoted by the inputted digital baseband signal and a phase fluctuation differential signal every sample timing;
    a determination section that determines a phase fluctuation speed indicated by an addition signal from the adding section using the threshold value; and
    a delay section that subjects the phase differential signal from the determination section to a delay corresponding to an interval of the sample timing; and
    when phase fluctuation speed indicated by the addition signal exceeds the threshold value, the determination section outputs portions exceeding the threshold value as the phase fluctuation differential signal, and outputs a phase fluctuation speed signal corresponding to the threshold value to the D/A converter and when the phase fluctuation speed indicated by the addition signal is less than or equal to the threshold value, outputs the addition signal as is to the D/A converter.

4. The two-point modulation type phase modulation apparatus according to claim 2, further comprising a threshold value changing section that changes the threshold value according to an average voltage supplied to the control voltage terminal, wherein the peak control section carries out smoothing of the peak portion using a threshold value for after changing.

5. The two-point modulation type phase modulation apparatus according to claim 4, wherein the threshold value changing section determines whether or not the threshold value enters a non-linear region of the voltage controlled oscillator based on the average voltage supplied, the threshold value, and the boundary voltage of the non-linear region and the linear region, and when it is determined that the non-linear region has been entered, changes the threshold value in such a manner as to be less than the clearance voltage between the boundary voltage and the average voltage supplied.

6. The two-point modulation type phase modulation apparatus according to claim 2, further comprising a threshold value changing section that changes the threshold value according to temperature information, wherein the peak control section carries out smoothing of the peak portion using a threshold value for after changing.

7. The two-point modulation type phase modulation apparatus according to claim 5, wherein the threshold value changing section changes the boundary voltage according to the temperature information, and when the threshold value enters the non-linear region, changes the threshold value to be less than or equal to a clearance voltage between the boundary voltage after changing and the average voltage supplied.

8. The two-point modulation type phase modulation apparatus according to claim 1, wherein the peak control section carries out smoothing of the peak portions by moving portions of the peak portions exceeding a predetermined threshold value to portions less than the predetermined threshold value before the appearance of the peak portion.

9. The two-point modulation type phase modulation apparatus according to claim 8, wherein:
    the peak control section comprising:
    a determination section that determines the phase fluctuation speed signal denoted by the inputted digital baseband signal;
    a delay section that subjects an output signal of the determination section to a delay by integer multiples of the sample timing; and an adding section that adds a phase fluctuation differential signal from the determination section and the output signal from the delay section to output to the D/A converter; and the determination section outputs a portion exceeding the threshold value as the phase differential signal and outputs a phase differential speed signal corresponding to the threshold value to the delay section when phase fluctuation speed denoted by the inputted digital baseband signal exceeds the threshold value, and outputs the inputted digital baseband signal as is to the delay section when phase fluctuation speed denoted by the inputted digital baseband signal is less than or equal to the threshold value.

10. The two-point modulation type phase modulation apparatus according to claim 1, wherein the peak control section carries out smoothing of the peak portions by moving portions of the peak portions exceeding a predetermined threshold value to portions less than the predetermined threshold value before and after the appearance of the peak portion.

11. A wireless communication apparatus comprising:

an amplitude-phase separating section that forms a baseband phase modulation signal and an amplitude modulation signal based on a baseband modulation signal;

a two-point modulation type phase modulation apparatus according to claim 1 that inputs the baseband phase modulation signal as an inputted digital baseband modulation signal, and outputs an RF phase modulation signal; and a high-frequency power amplifier that changes the amplitude of the RF phase modulation signal outputted by the two-point modulation type phase modulation apparatus according to the amplitude modulation signal.

* * * * *